(12) United States Patent
Wang

(10) Patent No.: US 10,995,266 B2
(45) Date of Patent: May 4, 2021

(54) ELECTROLUMINESCENT MATERIAL, METHOD FOR MANUFACTURING SAME, AND LIGHT EMITTING DEVICE

(71) Applicant: Wuhan China Star Optoelectronics Semiconductor Display Technology Co., Ltd., Wuhan (CN)

(72) Inventor: Yanjie Wang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 68 days.

(21) Appl. No.: 16/611,299

(22) PCT Filed: Sep. 11, 2019

(86) PCT No.: PCT/CN2019/105453
§ 371 (c)(1),
(2) Date: Nov. 6, 2019

(87) PCT Pub. No.: WO2020/258525
PCT Pub. Date: Dec. 30, 2020

(65) Prior Publication Data
US 2020/0399533 A1   Dec. 24, 2020

(30) Foreign Application Priority Data

Jun. 24, 2019 (CN) .................. 201910549064.X

(51) Int. Cl.
*C09K 11/06* (2006.01)
*H01L 51/50* (2006.01)
*H01L 51/00* (2006.01)

(52) U.S. Cl.
CPC .......... *C09K 11/06* (2013.01); *H01L 51/0059* (2013.01); *H01L 51/0072* (2013.01); *C09K 2211/1466* (2013.01); *H01L 51/5012* (2013.01); *H01L 51/5056* (2013.01); *H01L 51/5072* (2013.01)

(58) Field of Classification Search
CPC ............ C09K 11/06; C09K 2211/1146; H01L 51/0059; H01L 51/0072; H01L 51/5056; H01L 51/5012
USPC ............................................ 257/40; 428/690
See application file for complete search history.

(56) References Cited

U.S. PATENT DOCUMENTS

2017/0029362 A1* 2/2017 Howard, Jr. et al. ..................... C07C 211/61
548/660

* cited by examiner

*Primary Examiner* — Thinh T Nguyen

(57) ABSTRACT

The present application provides an electroluminescent material, a method for manufacturing the electroluminescent material, and a light emitting device, the asymmetric mono-cyanopyrazine of the pyrene nucleus of the electroluminescent material is used as an acceptor, and the pyrene nucleus has a large plane and rigid P-type delayed fluorescence characteristic, which can combine triplet excitons via triplet excitons-triplet excitons to enhance utilization of excitons, thereby to achieve an electroluminescent material, a method for manufacturing the electroluminescent material, and a light emitting device, to realize an electroluminescent material and a light emitting device with a high quantum efficiency.

17 Claims, 3 Drawing Sheets

ELECTROLUMINESCENT MATERIAL, METHOD FOR MANUFACTURING SAME, AND LIGHT EMITTING DEVICE

RELATED APPLICATIONS

This application is a National Phase of PCT Patent Application No. PCT/PCT/CN2019/105453 having International filing date of Sep. 11, 2019, which claims the benefit of priority of Chinese Patent Application No. 201910549064.X filed on Jun. 24, 2019. The contents of the above applications are all incorporated by reference as if fully set forth herein in their entirety.

FIELD AND BACKGROUND OF THE INVENTION

The present application relates to a lighting field, and particularly to an electroluminescent material, a method for manufacturing the electroluminescent material, and a light emitting device.

In prior art, for thermal activated delay fluorescent (TADF) materials, a small ΔEST and a high photoluminescence quantum yield (PLQY) are necessary conditions for manufacturing organic lighting-emitting diodes (OLED) with high efficiency. Currently, TADF materials with green light and sky blue light have achieved external quantum efficiency (EQE) of more than 30%, but TADF materials with red light and deep red light cannot achieve excellent device performances due to the energy gap law. It is necessary to provide a highly efficient electroluminescent material capable of emitting deep red light, a method for manufacturing the electroluminescent material, and a light emitting device.

SUMMARY OF THE INVENTION

The present application provides an electroluminescent material, a method for manufacturing the electroluminescent material, and a light emitting device, to realize an electroluminescent material and a light emitting device with a high quantum efficiency.

The present application provides an electroluminescent material, a structural formula of the electroluminescent material is $R_2$-$R_1$-$R_2$, wherein a structural formula of the $R_1$ group comprises one selected from the group consisting

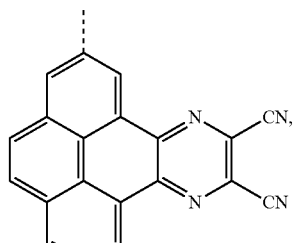

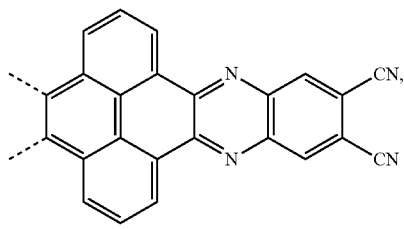

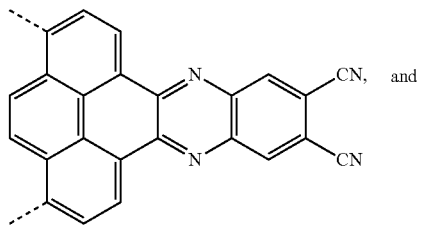

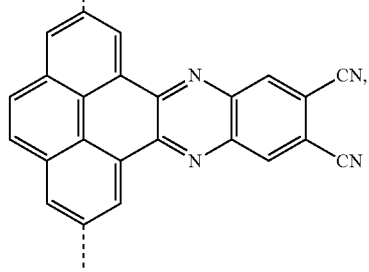

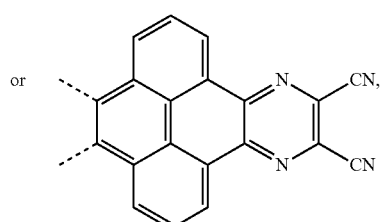

or

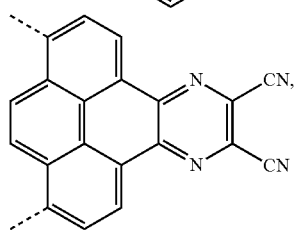

and a structural formula of the $R_2$ group comprises one selected from the group consisting of

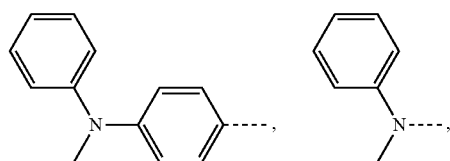

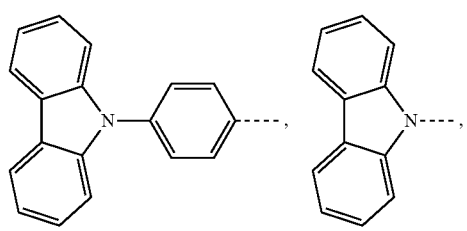

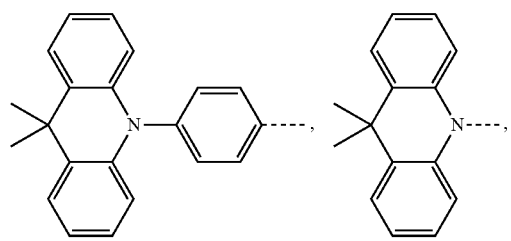
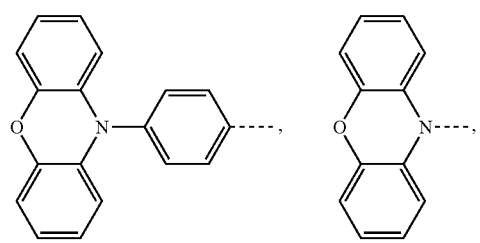
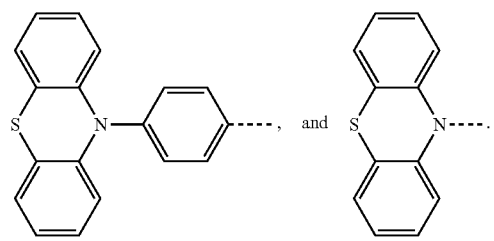
In the electroluminescent material, the structural formula of the electroluminescent material is
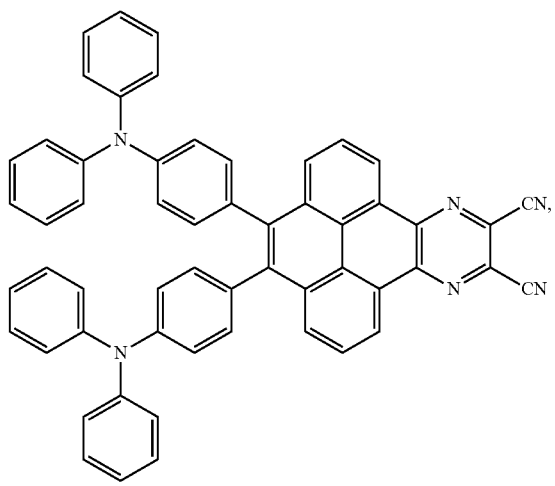 [SMILES: N#Cc1nc2c3cccc4c(-c5ccc(N(c6ccccc6)c6ccccc6)cc5)c(-c5ccc(N(c6ccccc6)c6ccccc6)cc5)c5cccc(c2nc1C#N)c5c43]
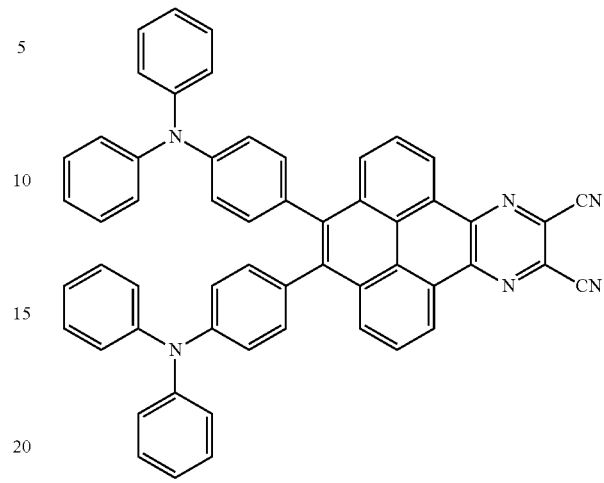
ranges from 710nm to 730nm.
In the electroluminescent material, the structural formula of the electroluminescent material is
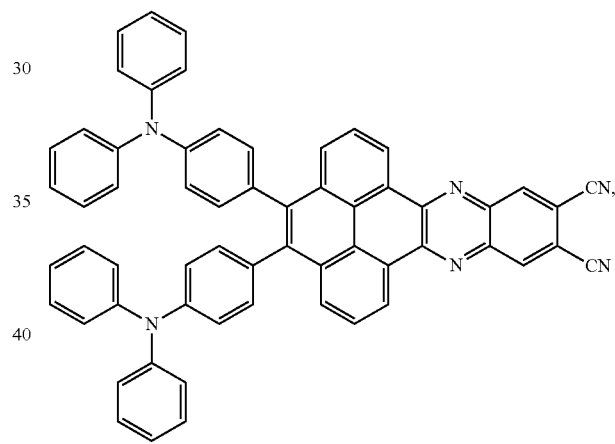
and a peak value of the electroluminescent material
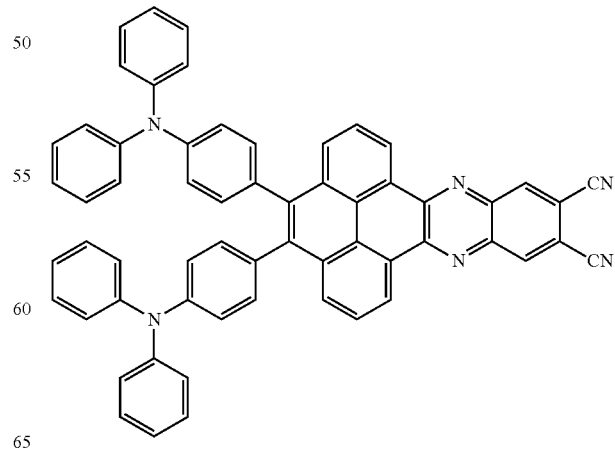
ranges from 750nm to 770nm.

The present application provides a method for manufacturing the electroluminescent material includes:

providing a first reactant and a second reactant, and reacting the first reactant and the second reactant to generate a first intermediate product, wherein the first reactant is a compound containing a $R_3$ group, a structural formula of the $R_3$ group is one selected from the group consisting of

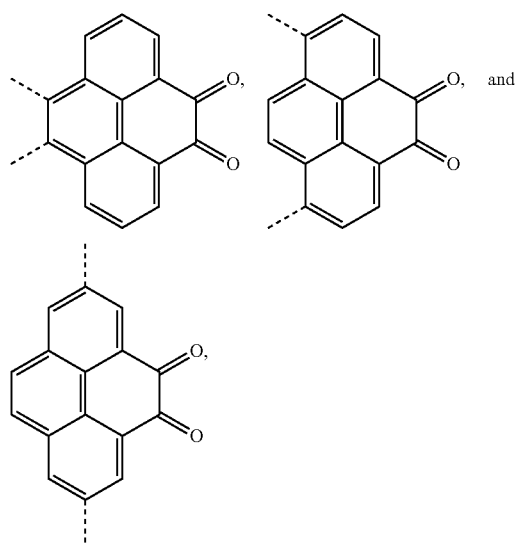

a structural formula of the second reactant is

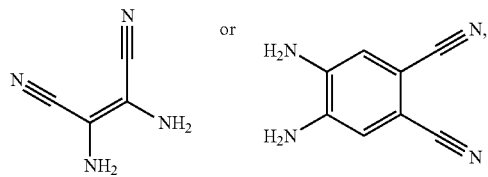

the first intermediate product is a compound containing a $R_1$ group, a structural formula of the $R_1$ group is one selected from the group

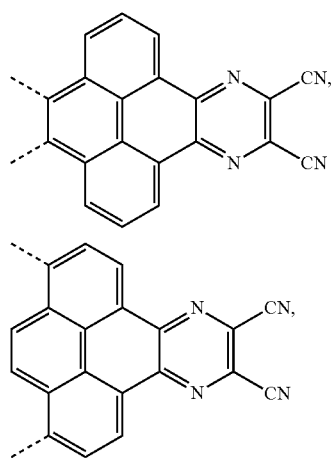

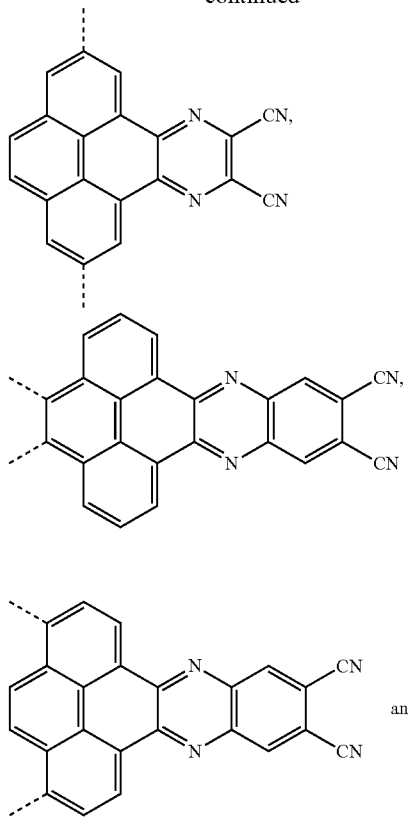

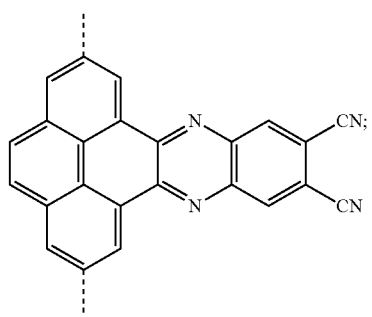

consisting of and providing a third reactant, and reacting the first intermediate product and the third reactant to generate the electroluminescent material, wherein the third reactant comprises a compound containing a $R_2$ group, and a structural formula of the $R_2$ group is

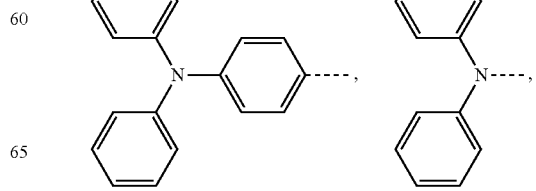

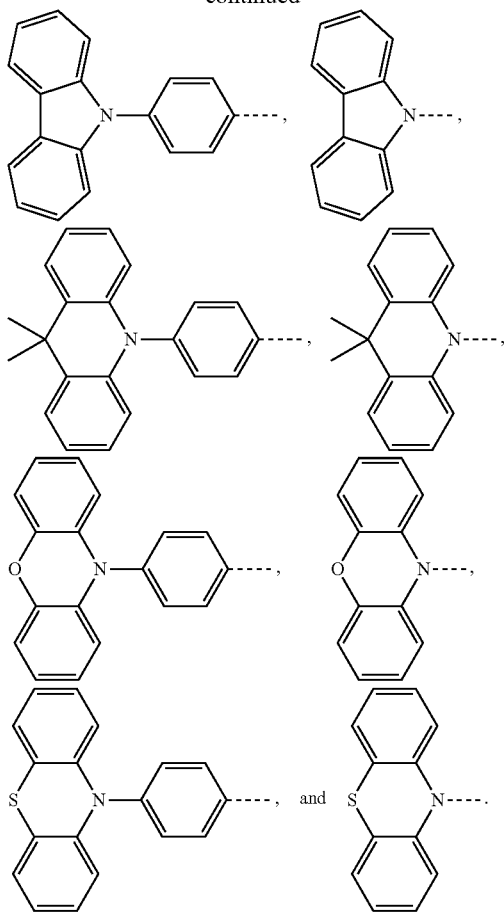

In the method for manufacturing the electroluminescent material of the present application, a structural formula of the first reactant is Br—R$_3$—Br, a structural formula of the first intermediate product is Br—R$_1$—Br In the method for manufacturing the electroluminescent material of the present application, in the step of reacting the first reactant and the second reactant to generate the first intermediate product, a relationship between a molar quantity of the first reactant and a molar quantity of the second reactant is that for 10 millimoles of the first reactant, there are 5 millimoles-20 millimoles of the second reactant.

In the method for manufacturing an electroluminescent material of the present application, the first reactant and the second reactant are reacted in a first solvent to generate the first intermediate product, and the first solvent includes acetic acid, formic acid, formaldehyde, hydroxypropionic acid, thioglycolic acid, indole-3-acetic acid, methyl formate, 2-hydroxyacetaldehyde, ethyl formate, methyl acetate, peroxypropionic acid, peracetic acid, or combinations thereof.

In the method for manufacturing an electroluminescent material of the present application, the third reactant is R$_2$—X, wherein the X group is a boronic acid group or a boronic acid pinacol ester group.

In the method for manufacturing the electroluminescent material of the present application, in the step of reacting the first intermediate product and the third reactant to generate the electroluminescent material, a relationship between a molar quantity of the first intermediate product and a molar quantity of the third reactant is that for 5 millimoles of the first intermediate product, there are 8 millimoles-15 millimoles of the third reactant.

In the method for manufacturing an electroluminescent material of the present application, the first intermediate product and the third reactant are reacted in a second solvent to generate the electroluminescent material, and the second solvent includes tetrahydrofuran, formaldehyde, ether, vinyl ether, diisopropyl ether, perchloroethylene, trichloroethylene, acetone, ethylene glycol ether, triethanolamine, or combinations thereof.

In the method for manufacturing an electroluminescent material of the present application, the second solvent contains an additive, the additive comprises sodium carbonate, potassium carbonate, potassium carbonate aqueous solution, tetrakis(triphenylphosphine)palladium, n-butyllithium, potassium hydroxide, sodium hydroxide and sodium t-butoxide, or combinations thereof.

In the method for manufacturing an electroluminescent material of the present application, the second solvent is tetrahydrofuran, the additive is aqueous solution of sodium carbonate and tetrakis(triphenylphosphine)palladium.

In the method for manufacturing an electroluminescent material of the present application, a structural formula of the electroluminescent material is R$_2$-R$_1$-R$_2$.

The present application provides a light emitting device including:

a substrate layer, wherein the substrate layer includes a base and an anode layer, the anode layer is formed on the base;

a hole injection layer, wherein the hole injection layer is formed on the anode layer;

a hole transport layer, wherein the hole transport layer is formed on the hole injection layer;

a light emitting layer, wherein the light emitting layer is formed on the hole transport layer;

an electron transport layer, wherein the electron transport layer is formed on the light emitting layer; and a cathode layer, wherein the cathode layer is formed on the electron transport layer;

the light emitting layer includes the electroluminescent material, a structural formula of the electroluminescent material is R$_2$-R$_1$-R$_2$, wherein a structural formula of R$_1$ group comprises one selected from the group consisting of

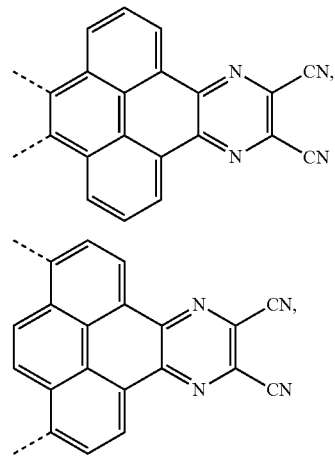

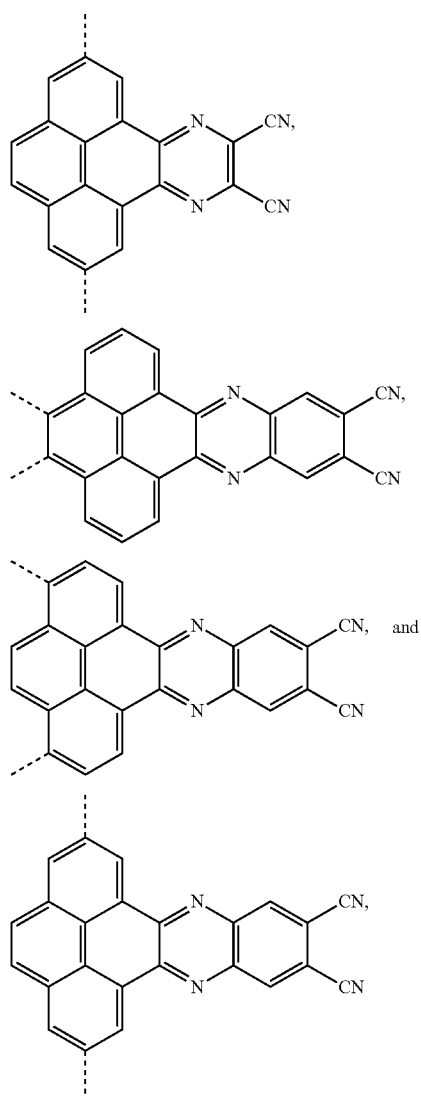
and a structural formula of R$_2$ group comprises one selected from the group consisting of
In the light emitting device, the structural formula of the electroluminescent material is and a peak value of the electroluminescent material

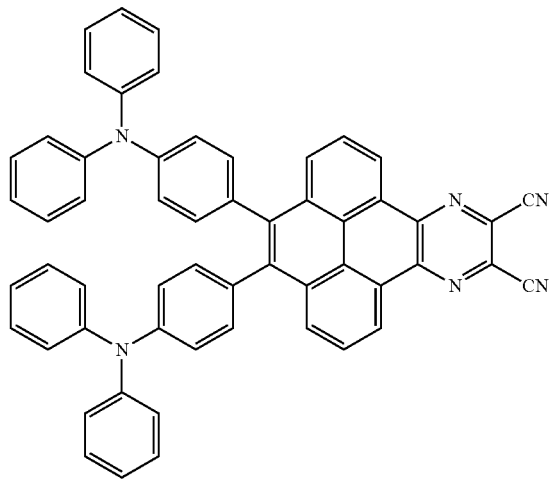 [SMILES: N#Cc1nc2c3cccc4c(-c5ccc(N(c6ccccc6)c6ccccc6)cc5)c(-c5ccc(N(c6ccccc6)c6ccccc6)cc5)c5cccc(c2nc1C#N)c5c43]

ranges from 710nm to 730nm.

In the light emitting device, the structural formula of the electroluminescent material is

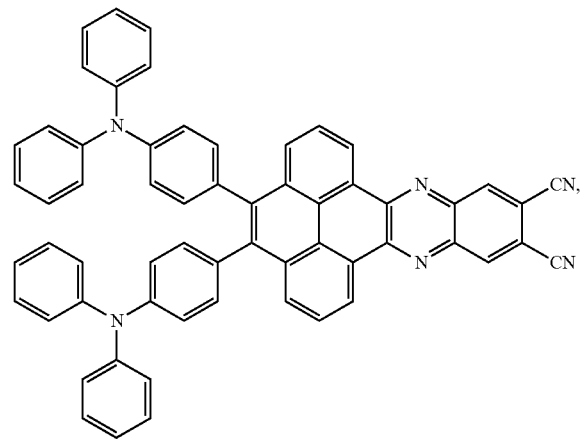 [SMILES: N#Cc1cc2nc3c4cccc5c(-c6ccc(N(c7ccccc7)c7ccccc7)cc6)c(-c6ccc(N(c7ccccc7)c7ccccc7)cc6)c6cccc(c3nc2cc1C#N)c6c54]

and a peak value of the electroluminescent material

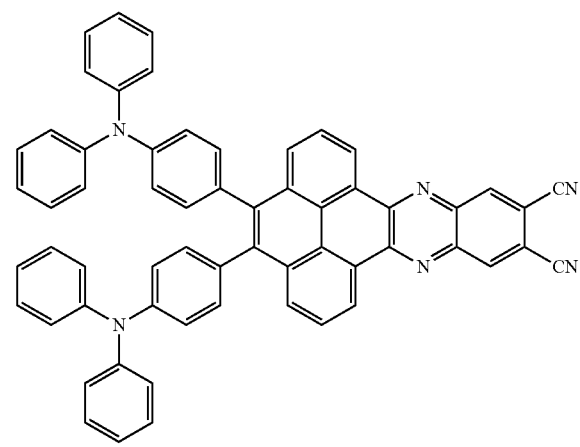 [SMILES: N#Cc1cc2nc3c4cccc5c(-c6ccc(N(c7ccccc7)c7ccccc7)cc6)c(-c6ccc(N(c7ccccc7)c7ccccc7)cc6)c6cccc(c3nc2cc1C#N)c6c54]

ranges from 750nm to 770nm.

In the light emitting device, a thickness of the light emitting layer ranges from 20nm to 60nm.

The benefit is: the present application provides an electroluminescent material, a method for manufacturing the electroluminescent material, and a light emitting device, and via reacting the first reactant and the second reactant to generate the first intermediate product, reacting the first intermediate product and the third reactant to generate the electroluminescent material, and the asymmetric monocyanopyrazine of the pyrene nucleus is used as an acceptor, and the pyrene nucleus has a large plane and rigid P-type delayed fluorescence characteristic, which can combine triplet excitons via triplet excitons-triplet excitons to enhance utilization of excitons, thereby to achieve an electroluminescent material, a method for manufacturing the electroluminescent material, and a light emitting device, to realize an electroluminescent material and a light emitting device with a high quantum efficiency.

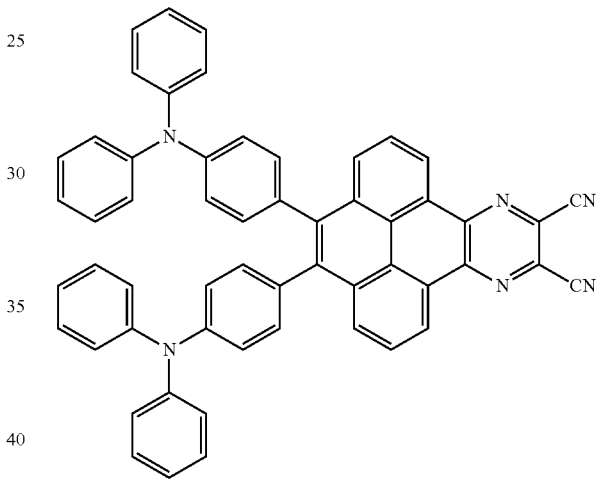

of the present application.

Figure 2:
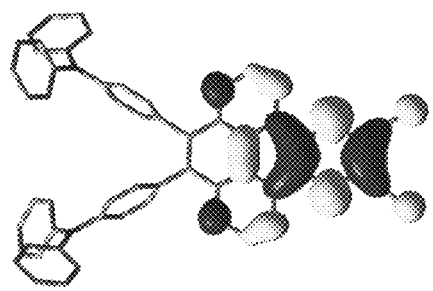

FIG. 2 is a theoretical simulation calculation diagram of lowest unoccupied molecular orbital (LUMO) of the electroluminescent material

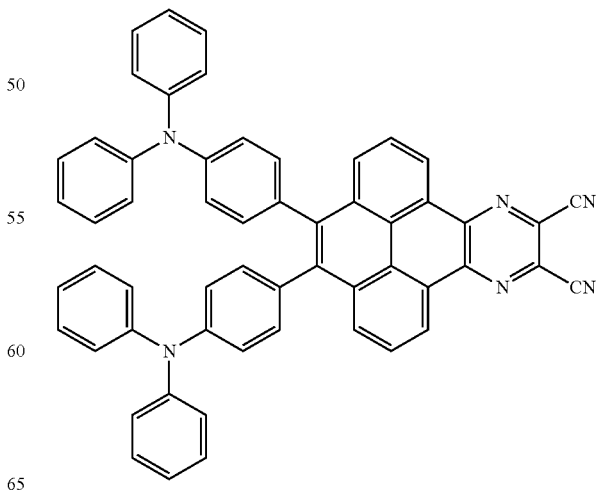

of the present application.

Figure 3:
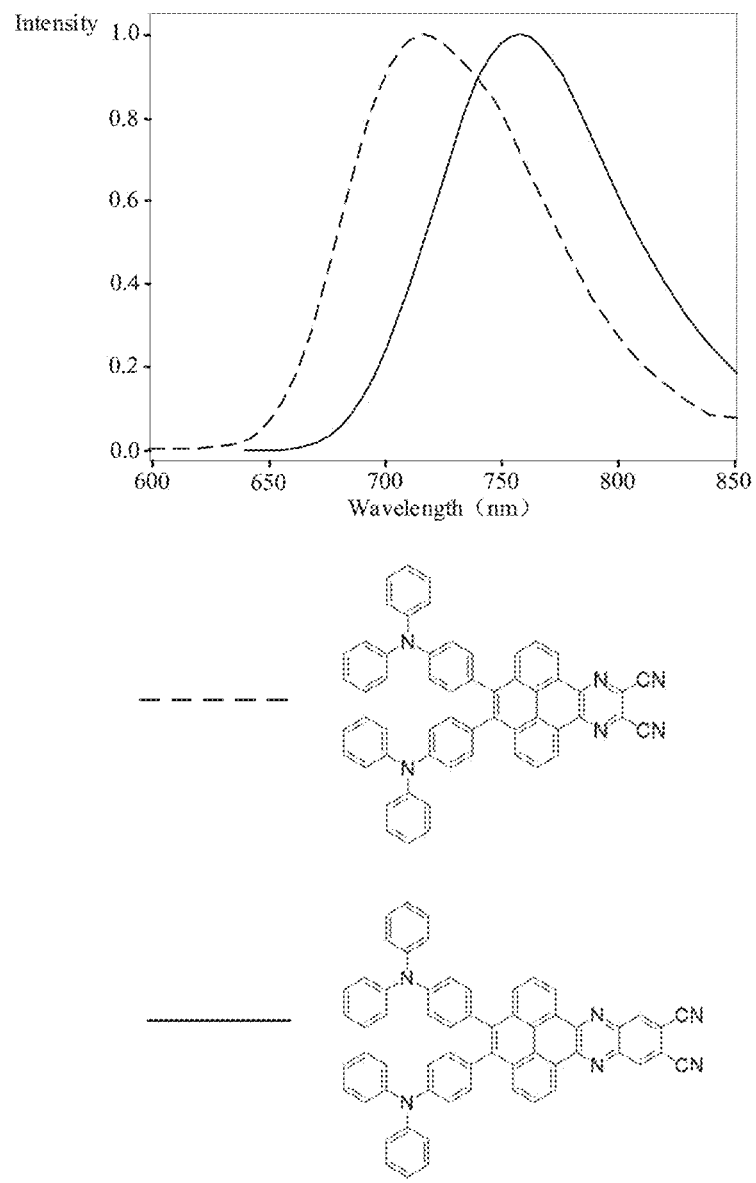

FIG. 3 is a fluorescence emission spectrogram under a pure film of the electroluminescent material

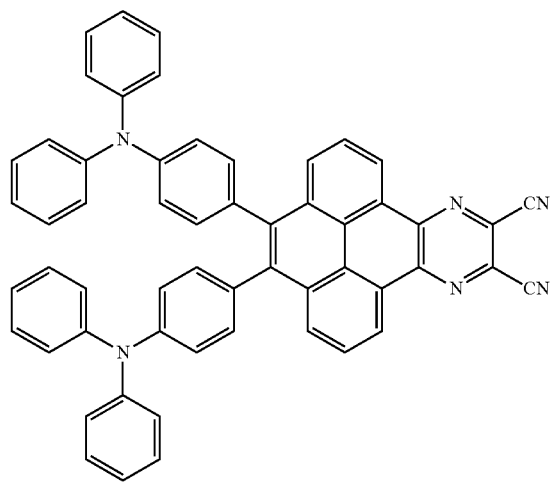 [SMILES: N#Cc1nc2c3cccc4c(-c5ccc(N(c6ccccc6)c6ccccc6)cc5)c(-c5ccc(N(c6ccccc6)c6ccccc6)cc5)c5cccc(c2nc1C#N)c5c43]

and the electroluminescent material

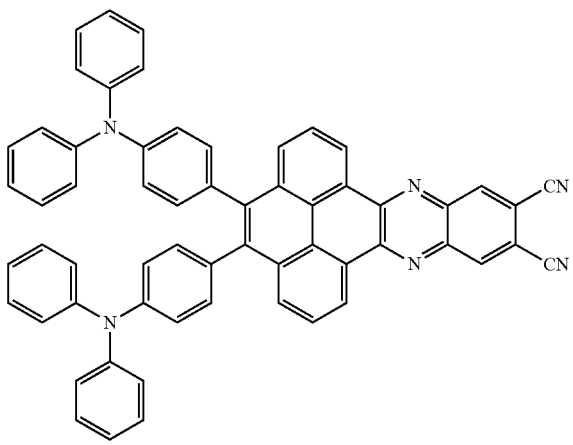 [SMILES: N#Cc1cc2nc3c4cccc5c(-c6ccc(N(c7ccccc7)c7ccccc7)cc6)c(-c6ccc(N(c7ccccc7)c7ccccc7)cc6)c6cccc(c3nc2cc1C#N)c6c54]

of the present application.

Figure 4:
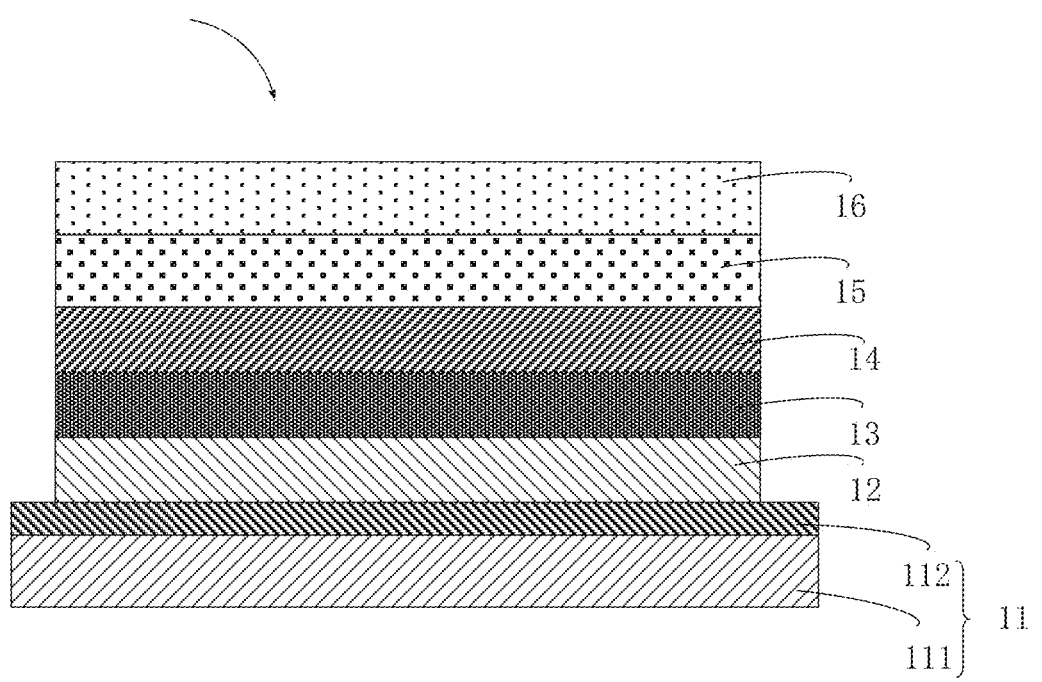

FIG. 4 is a schematic structural view of a light emitting device of the present application.

DESCRIPTION OF SPECIFIC EMBODIMENTS OF THE INVENTION

The present application provides an electroluminescent material. A structural formula of the electroluminescent material is $R_2$-$R_1$-$R_2$. A structural formula of $R_1$ group includes one selected from the group consisting of

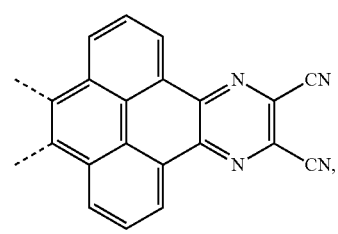

-continued

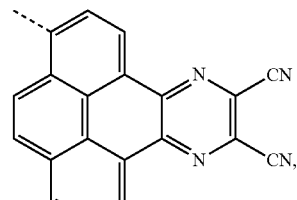

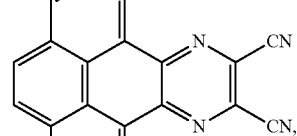

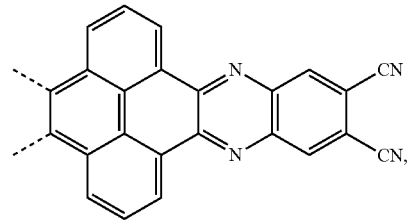

, and

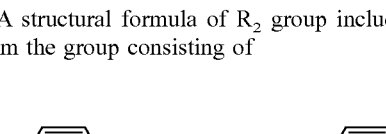

A structural formula of $R_2$ group includes one selected from the group consisting of

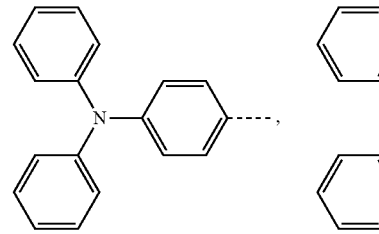

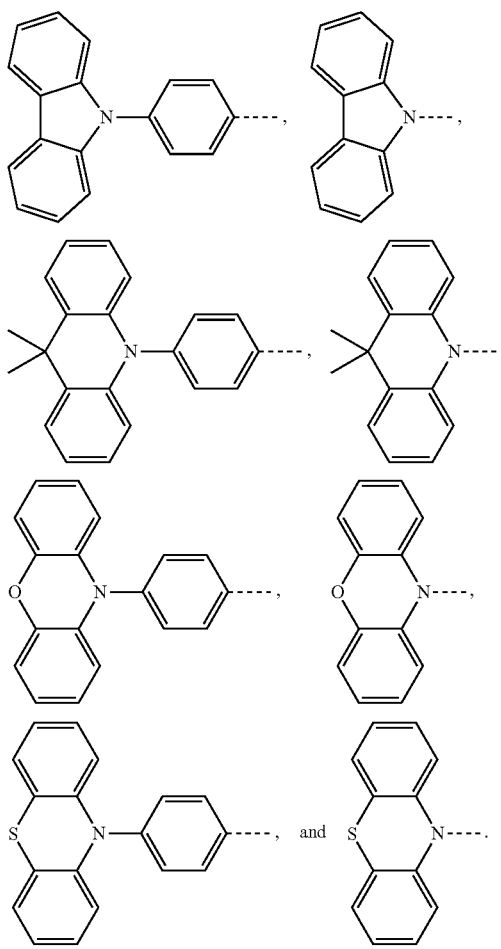

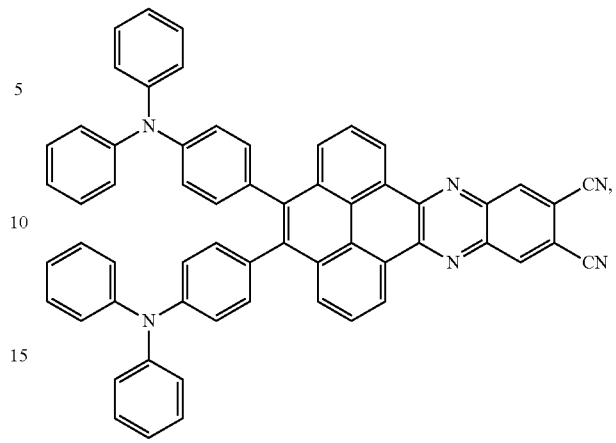

and so on.

The present application also provides a method for manufacturing the electroluminescent material including:

A, providing a first reactant and a second reactant, and reacting the first reactant and the second reactant to generate a first intermediate product, wherein the first reactant is a compound containing a $R_3$ group, a structural formula of the $R_3$ group is one selected from the group consisting of

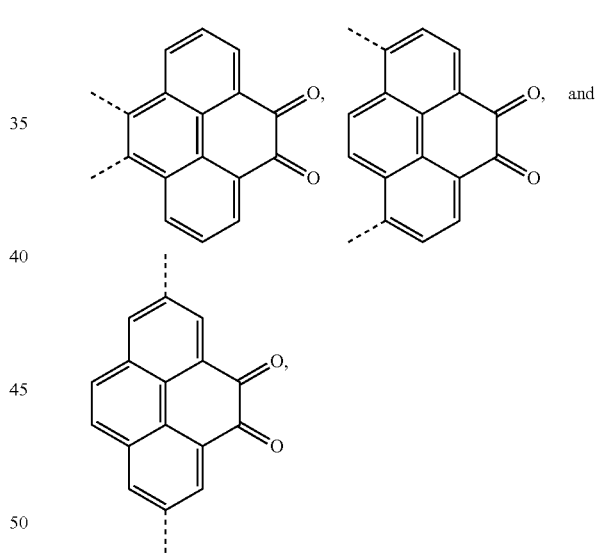

The electroluminescent material is a heavy red light thermally activated delayed fluorescence (TADF) material. The electroluminescent material has 60 different structural formulas by permutations of the $R_1$ group and the $R_2$ group, in some embodiments, structural formulas of the electroluminescent materials can be

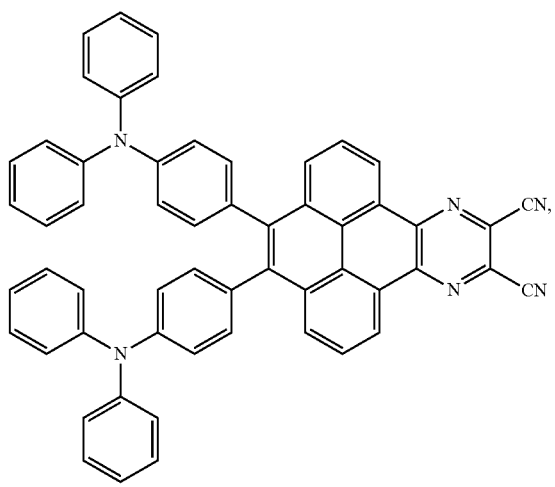 [SMILES: N#Cc1nc2c3cccc4c(-c5ccc(N(c6ccccc6)c6ccccc6)cc5)c(-c5ccc(N(c6ccccc6)c6ccccc6)cc5)c5cccc(c2nc1C#N)c5c43]

a structural formula of the second reactant is

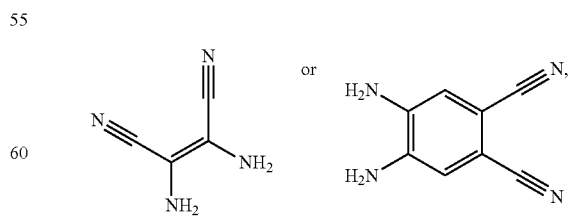

the first intermediate product is a compound containing a $R_1$ group, a structural formula of the $R_1$ group is one selected from the group consisting of

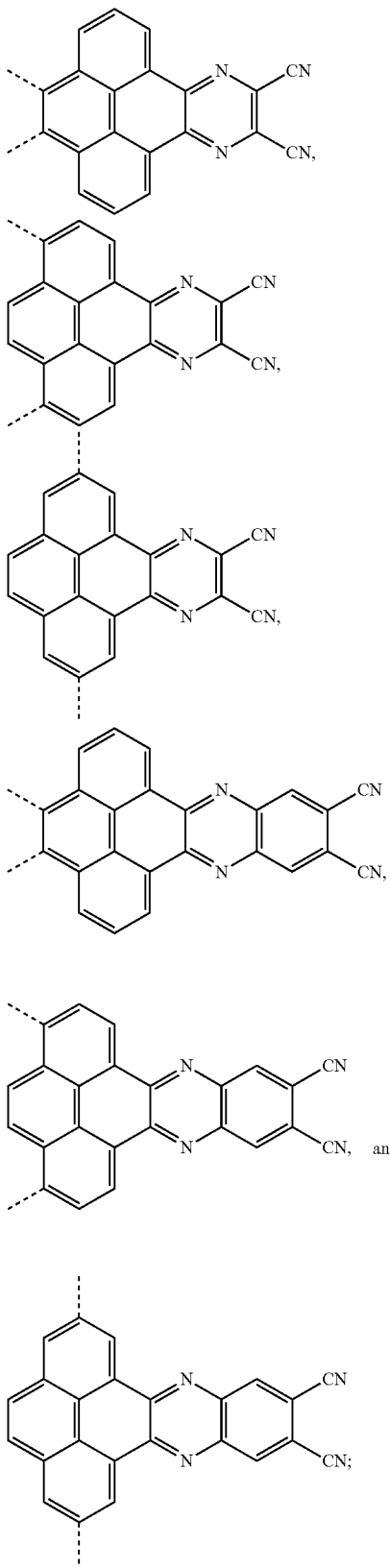

A structural formula of the first reactant can be Br—R$_3$—Br. A structural formula of the first intermediate product can be Br—R$_1$—Br When the second reactant is

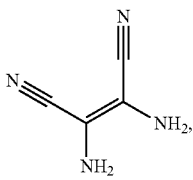

a reaction equation of reacting the first reactant and the second reactant to generate the first intermediate product can be:

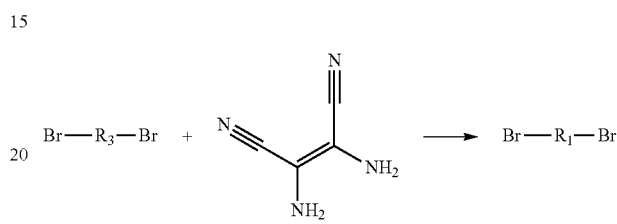

When the second reactant is

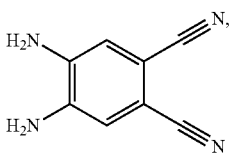 [SMILES: N#Cc1cc(N)c(N)cc1C#N]

a reaction equation of reacting the first reactant and the second reactant to generate the first intermediate product can be:

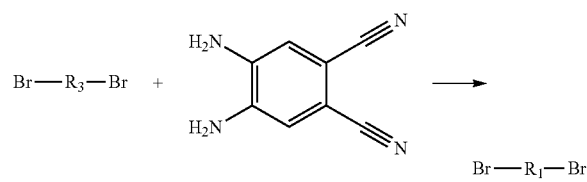

In one embodiment, in the step of reacting the first reactant and the second reactant to generate the first intermediate product, a relationship between a molar quantity of the first reactant and a molar quantity of the second reactant is that for 10 millimoles of the first reactant, there are 5 millimoles-20 millimoles of the second reactant. In detail, the relationship between a molar quantity of the first reactant and a molar quantity of the second reactant can be that for 10 millimoles of the first reactant, there are 10 millimoles of the second reactant. The relationship between a molar quantity of the first reactant and a molar quantity of the second reactant can be that for 1 molar of the first reactant, there are 1.5 molars of the second reactant In one embodiment, the first reactant and the second reactant are reacted in a first solvent to generate the first intermediate product, and the first solvent includes acetic acid, formic acid, formaldehyde, hydroxypropionic acid, thioglycolic acid, indole-3-acetic acid, methyl formate, 2-hydroxyacetaldehyde, ethyl formate, methyl acetate, peroxypropionic acid, peracetic acid, or combinations thereof.

In one embodiment, the first reactant can be

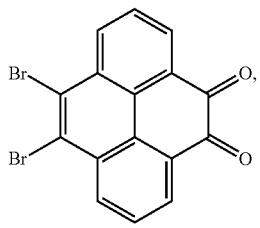 [SMILES: O=c1c(=O)c2cccc3c(Br)c(Br)c4cccc1c4c32]

and the second reactant can be

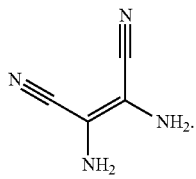

In one embodiment, a reaction equation of reacting the first reactant and the second reactant to generate the first intermediate product can be:

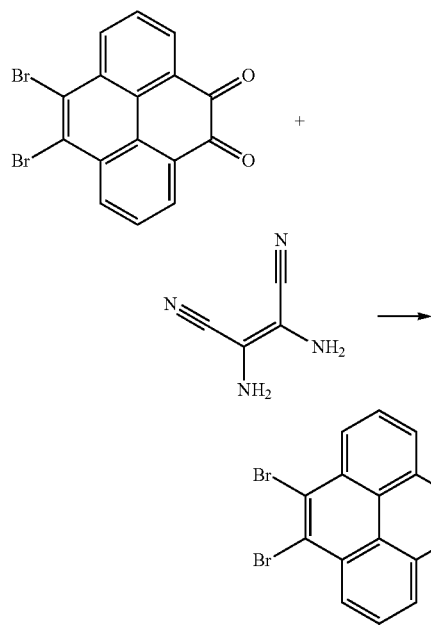

In one embodiment, 10 millimoles of the first reactant

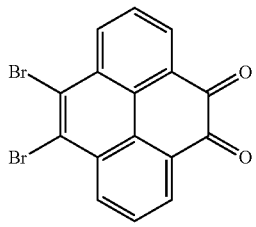

and 10 millimoles of the second reactant

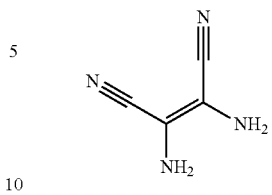

are added into 100 milliliters Schlenk bottle, 30mL-60mL of the first solvent acetic acid is added, those are heated and reacted at an argon atmosphere for 24 hours to obtain a first mixture containing the first intermediate product, a separating and purifying process is employed for the first mixture to obtain the first intermediate product

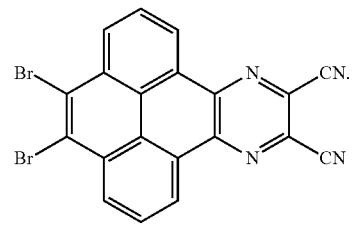 [SMILES: N#Cc1nc2c3cccc4c(Br)c(Br)c5cccc(c2nc1C#N)c5c43]

In one embodiment, the first reactant can be

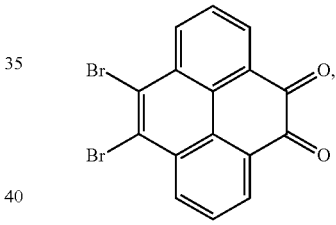

and the second reactant can be

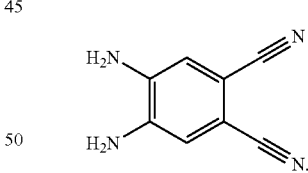

In one embodiment, a reaction equation of reacting the first reactant and the second reactant to generate the first intermediate product also can be:

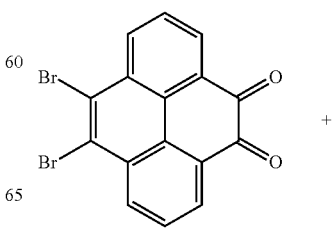

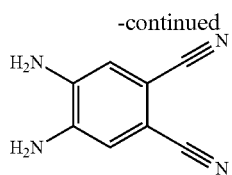

→

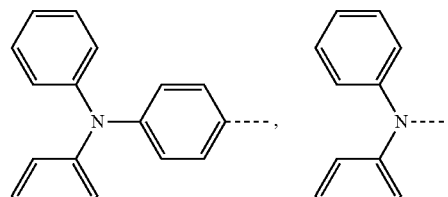

In one embodiment, 100 millimoles of the first reactant

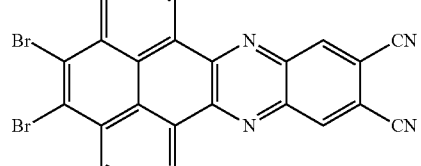

and 10 millimoles of the second reactant

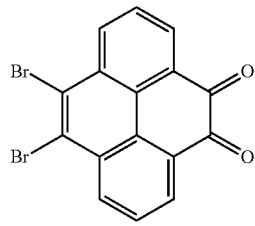

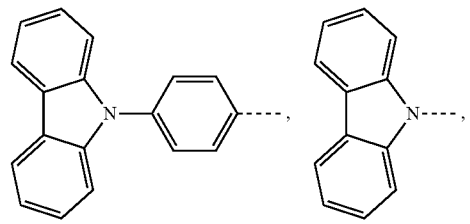

are added into 100 milliliters Schlenk bottle, 40mL-50mL of the first solvent acetic acid is added, those are heated and reacted at an argon atmosphere for 12-36 hours to obtain a first mixture containing the first intermediate product, a separating and purifying process is employed for the first mixture to obtain the first intermediate product

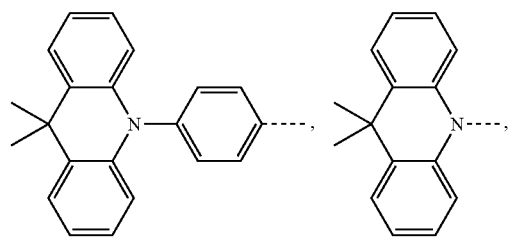

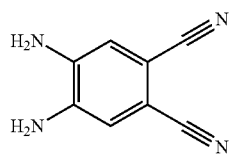 [SMILES: N#Cc1cc(N)c(N)cc1C#N]

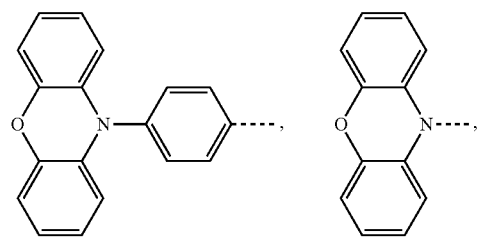

In some embodiments, the first intermediate product is yellow powder, and a yield of the first intermediate product is more than 80%.

B, providing a third reactant, and reacting the first intermediate product and the third reactant to generate the electroluminescent material, wherein the third reactant comprises a compound containing a $R_2$ group, and a structural formula of the $R_2$ group is

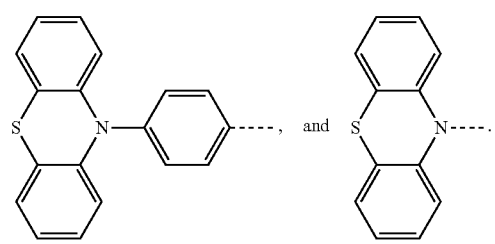

A structural formula of the electroluminescent material is $R_2$-$R_1$-$R_2$. A structural formula of $R_1$ group includes one selected from the group consisting of

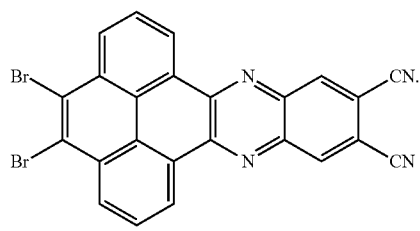 [SMILES: N#Cc1cc2nc3c4cccc5c(Br)c(Br)c6cccc(c3nc2cc1C#N)c6c54]

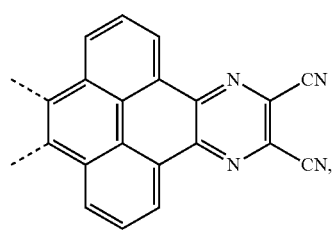

-continued

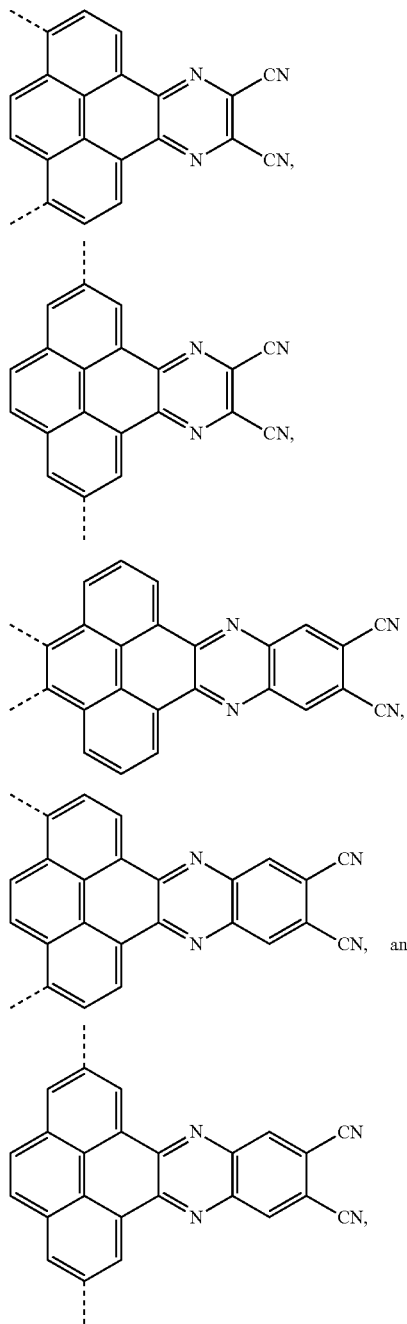

and a structural formula of $R_2$ group includes one selected from the group consisting of

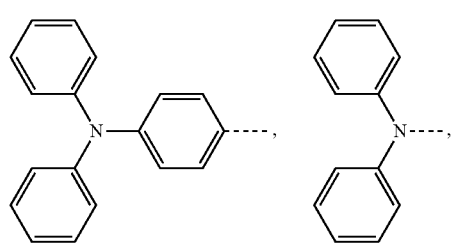

-continued

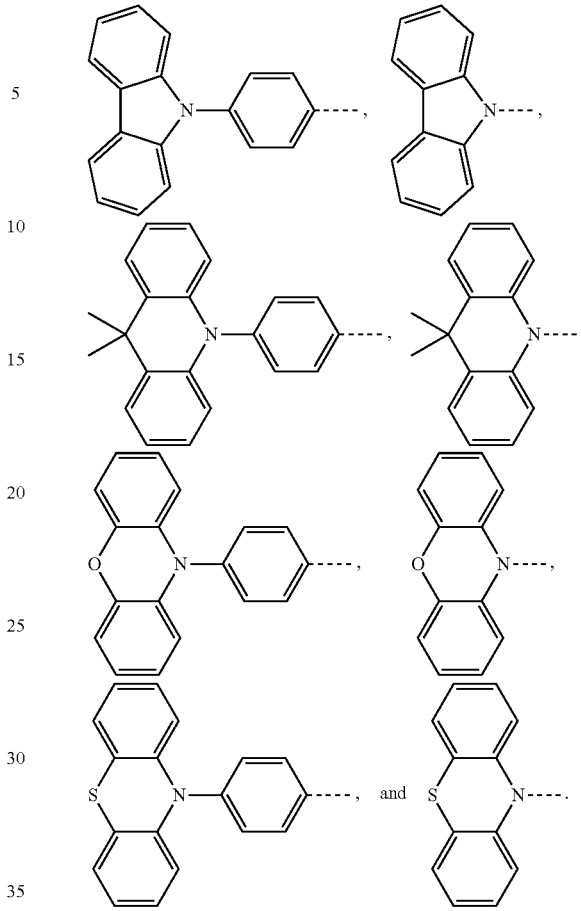

The third reactant can be $R_2$—X. The X group can be a boronic acid group or a boronic acid pinacol ester group.

A reaction equation of reacting the first intermediate product and the third reactant to generate the electroluminescent material can be:

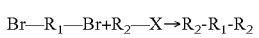

Br—$R_1$—Br+$R_2$—X→$R_2$-$R_1$-$R_2$

Wherein, $R_2$—X is a compound containing the $R_2$ group.

In the step of reacting the first intermediate product and the third reactant to generate the electroluminescent material, a relationship between a molar quantity of the first intermediate product and a molar quantity of the third reactant is that for 5 millimoles of the first intermediate product, there are 8 millimoles-15 millimoles of the third reactant. In detail, a relationship between a molar quantity of the first intermediate product and a molar quantity of the third reactant can be that for 5 millimoles of the first intermediate product, there are 11 millimoles of the third reactant. A relationship between a molar quantity of the first intermediate product and a molar quantity of the third reactant can be that for 1 molars of the first intermediate product, there are 2 molars of the third reactant.

In one embodiment, the first intermediate product and the third reactant are reacted in a second solvent to generate the electroluminescent material, and the second solvent includes tetrahydrofuran, formaldehyde, ether, vinyl ether, diisopropyl ether, perchloroethylene, trichloroethylene, acetone, ethylene glycol ether, triethanolamine, or combinations thereof.

In one embodiment, the second solvent contains an additive, the additive includes sodium carbonate, potassium carbonate, potassium carbonate aqueous solution, tetrakis(triphenylphosphine)palladium, n-butyllithium, potassium hydroxide, sodium hydroxide and sodium t-butoxide, or combinations thereof.

In one embodiment, the first intermediate product can be

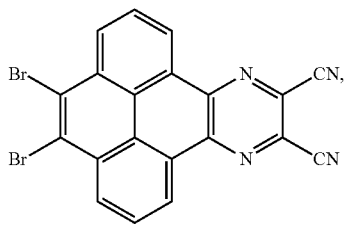

and the third reactant can be

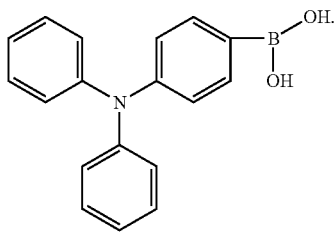 [SMILES: OB(O)c1ccc(N(c2ccccc2)c2ccccc2)cc1]

In one embodiment, a reaction equation of reacting the first intermediate product and the third reactant to generate the electroluminescent material can be:

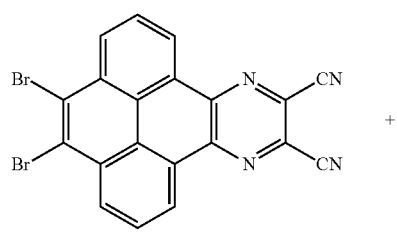

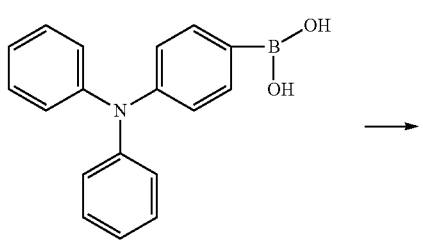

-continued

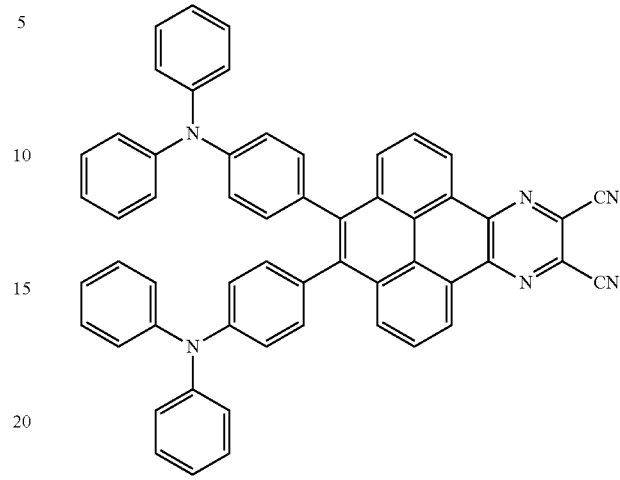

In some embodiments, 5 millimoles of the first intermediate product

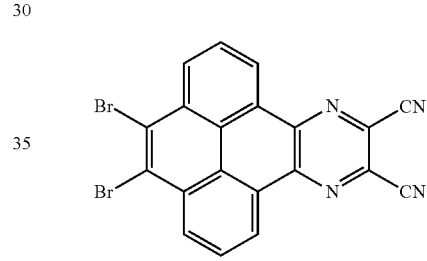

and 11 millimoles of the third reactant

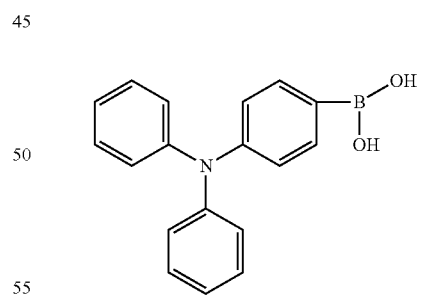

are added into a 250 ml tri-neck bottle, the second solvent tetrahydrofuran is added, and the additive sodium carbonate aqueous solution is added, an argon is applied to exchange gas, the additive tetrakis(triphenylphosphine)palladium is added, those are heated to a temperature of 80 degrees Celsius and reflowed reacted 24 hours to obtain the second mixture containing the electroluminescent material, a separating and purifying process is employed for the second mixture to obtain the electroluminescent material In one embodiment, the first intermediate product can be

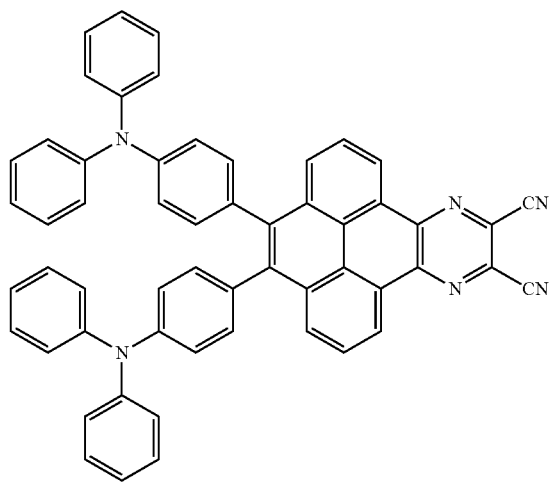 [SMILES: N#Cc1nc2c3cccc4c(-c5ccc(N(c6ccccc6)c6ccccc6)cc5)c(-c5ccc(N(c6ccccc6)c6ccccc6)cc5)c5cccc(c2nc1C#N)c5c43]

and the third reactant can be

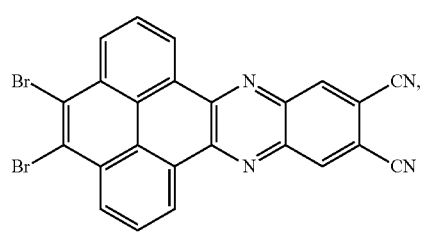

In one embodiment, a reaction equation of reacting the first intermediate product and the third reactant to generate the electroluminescent material also can be:

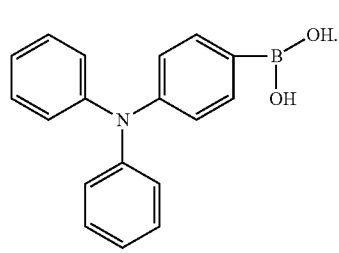 [SMILES: OB(O)c1ccc(N(c2ccccc2)c2ccccc2)cc1] +

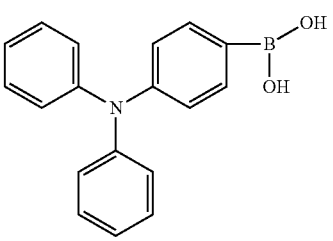 [SMILES: OB(O)c1ccc(N(c2ccccc2)c2ccccc2)cc1]

-continued

→

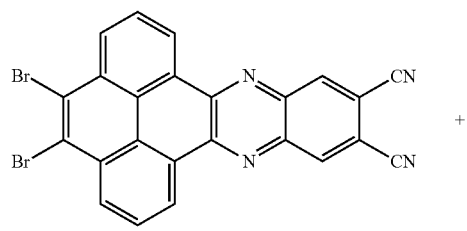

In some embodiments, 5 millimoles of the first intermediate product and 11 millimoles of the third reactant are added into a 250 ml tri-neck bottle, the second solvent tetrahydrofuran is added, and the additive sodium carbonate aqueous solution is added, an argon is applied to exchange gas, the additive tetrakis(triphenylphosphine)palladium is added, those are heated to a temperature of 60 degrees Celsius to 100 degrees Celsius, and reflowed reacted 12 hours to 24 hours to obtain the second mixture containing the electroluminescent material, a separating and purifying process is employ for the second mixture to obtain the electroluminescent material

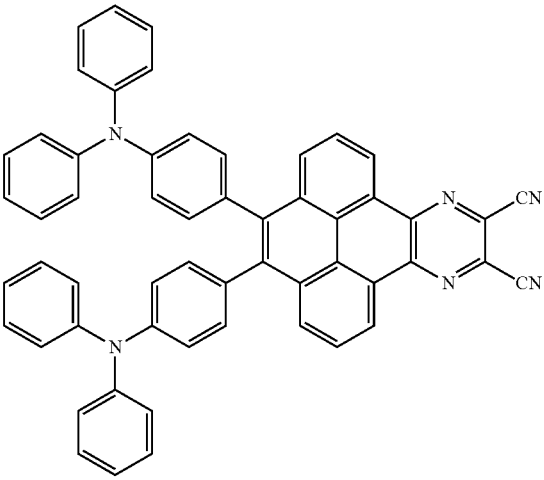

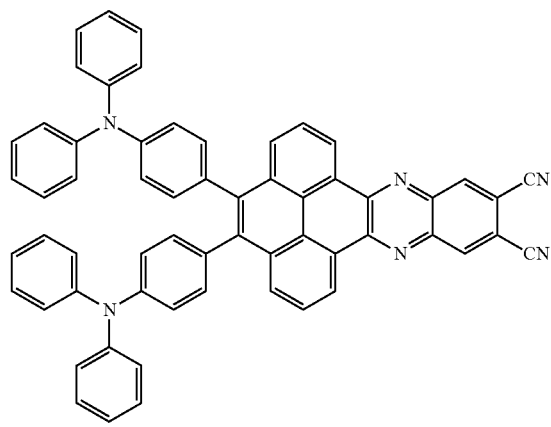 [SMILES: N#Cc1cc2nc3c4cccc5c(-c6ccc(N(c7ccccc7)c7ccccc7)cc6)c(-c6ccc(N(c7ccccc7)c7ccccc7)cc6)c6cccc(c3nc2cc1C#N)c6c54]

Figure 1:
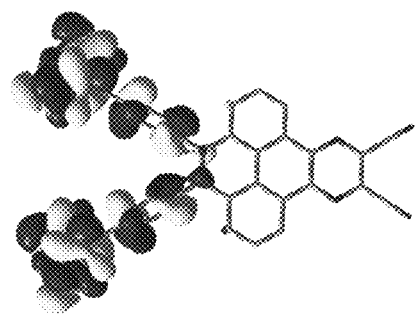
FIG. 1 is a theoretical simulation calculation diagram of highest occupied molecular orbital (HOMO) of an electroluminescent material

Referring to FIG. 1 and FIG. 2, FIG. 1 is a theoretical simulation calculation diagram of highest occupied molecular orbital (HOMO) of an electroluminescent material of the present application, FIG. 2 is a theoretical simulation calculation diagram of lowest unoccupied molecular orbital (LUMO) of the electroluminescent material of the present application. Electron cloud distribution overlap between a highest occupied molecular orbital and a lowest unoccupied molecular orbital of the electroluminescent material

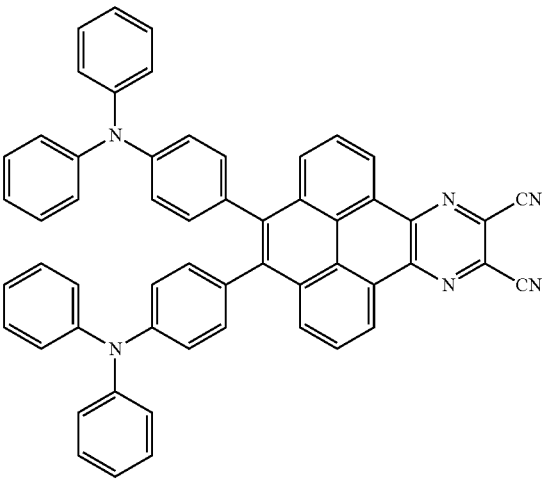 [SMILES: N#Cc1nc2c3cccc4c(-c5ccc(N(c6ccccc6)c6ccccc6)cc5)c(-c5ccc(N(c6ccccc6)c6ccccc6)cc5)c5cccc(c2nc1C#N)c5c43]

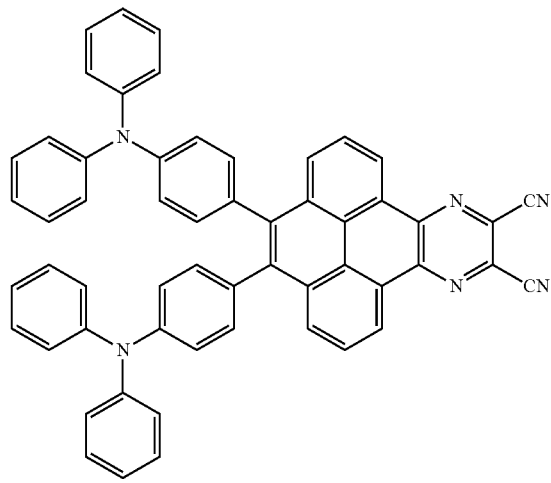 [SMILES: N#Cc1nc2c3cccc4c(-c5ccc(N(c6ccccc6)c6ccccc6)cc5)c(-c5ccc(N(c6ccccc6)c6ccccc6)cc5)c5cccc(c2nc1C#N)c5c43]

is small, a donor group is occupied by the highest occupied molecular orbital, and an acceptor group is occupied by the lowest unoccupied molecular orbital.

Referring to table 1, table 1 is peak values of the fluorescence spectrums, energy level values, and photoluminescence quantum yields of the electroluminescent materials.

TABLE 1
| Electroluminescent Material | PL Peak (nm) | S₁ (eV) | T₁ (eV) | ΔE_ST (eV) | PLQY (%) |
|---|---|---|---|---|---|
| 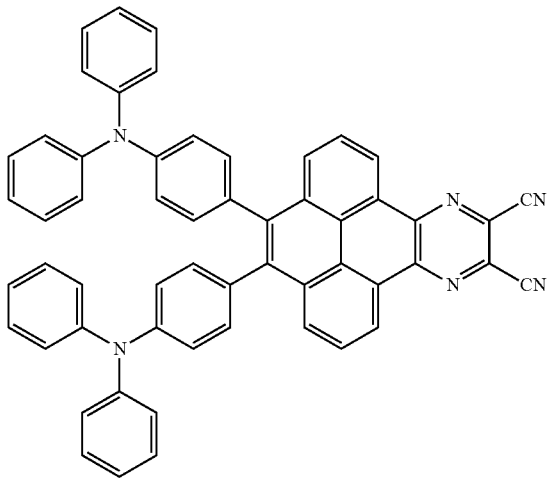 [SMILES: N#Cc1nc2c3cccc4c(-c5ccc(N(c6ccccc6)c6ccccc6)cc5)c(-c5ccc(N(c6ccccc6)c6ccccc6)cc5)c5cccc(c2nc1C#N)c5c43] | 716 | 2.05 | 2.03 | 0.03 | 78 |
| 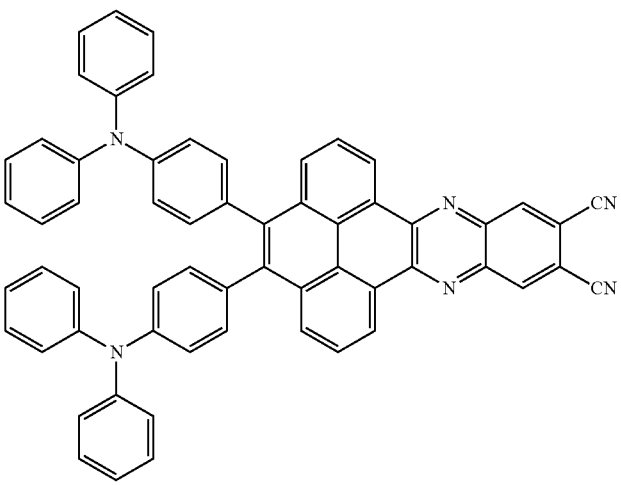 [SMILES: N#Cc1cc2nc3c4cccc5c(-c6ccc(N(c7ccccc7)c7ccccc7)cc6)c(-c6ccc(N(c7ccccc7)c7ccccc7)cc6)c6cccc(c3nc2cc1C#N)c6c54] | 758 | 2.01 | 1.96 | 0.05 | 65 |

Wherein, the PL Peak is a peak value of a fluorescence spectrum of the electroluminescent material, $S_1$ is the lowest singlet energy level value, T1 is the lowest triplet energy level value, $\Delta E_{ST}=S_1-T_1$, and PLQY is photoluminescence quantum yield.

Referring to FIG. 3, FIG. 3 is a fluorescence emission spectrogram under a pure film of the electroluminescent material

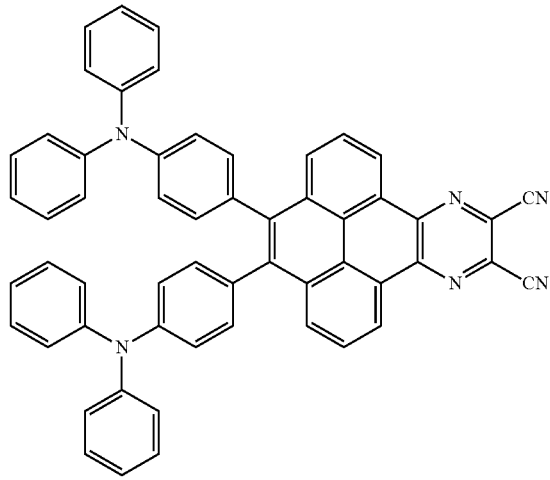 [SMILES: N#Cc1nc2c3cccc4c(-c5ccc(N(c6ccccc6)c6ccccc6)cc5)c(-c5ccc(N(c6ccccc6)c6ccccc6)cc5)c5cccc(c2nc1C#N)c5c43]

and the electroluminescent material

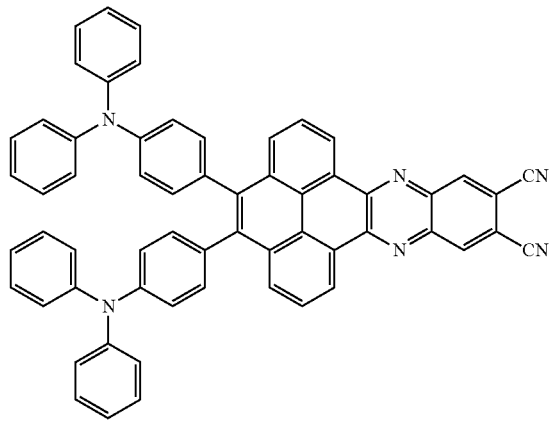 [SMILES: N#Cc1cc2nc3c4cccc5c(-c6ccc(N(c7ccccc7)c7ccccc7)cc6)c(-c6ccc(N(c7ccccc7)c7ccccc7)cc6)c6cccc(c3nc2cc1C#N)c6c54]

of the present application. The peak value of the electroluminescent material

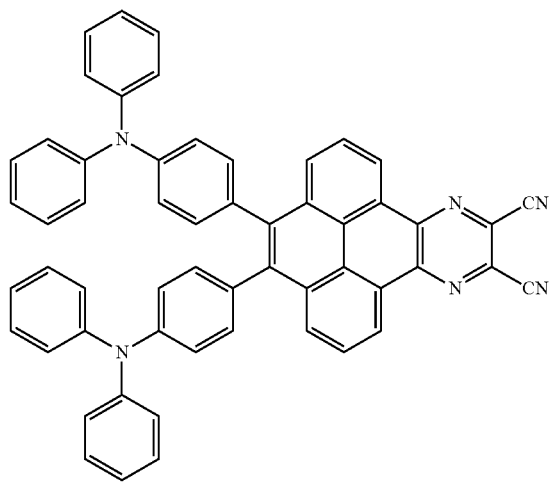 [SMILES: N#Cc1nc2c3cccc4c(-c5ccc(N(c6ccccc6)c6ccccc6)cc5)c(-c5ccc(N(c6ccccc6)c6ccccc6)cc5)c5cccc(c2nc1C#N)c5c43]

is between 710nm-730nm. The peak value of the electroluminescent material

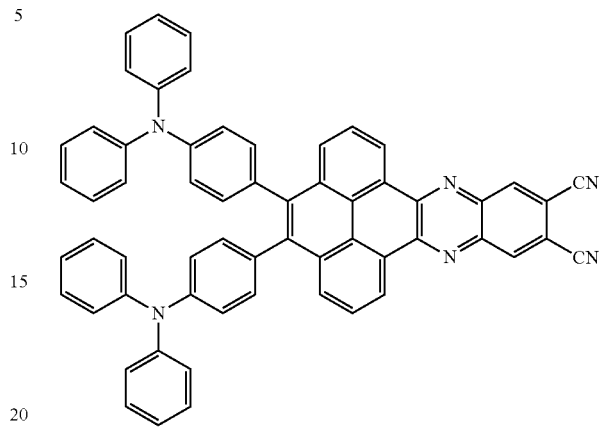

is between 750nm-770nm. A wavelength of the peak value corresponding to the wavelength is a wavelength of red light. Therefore, the electroluminescent material of the present application is a red light emitted.

Referring to FIG. 4, the present application provides a light emitting device 100. The light emitting device includes a substrate layer 11, a hole injection layer 12, a hole transport layer 13, a light emitting layer 14, an electron transport layer 15, and a cathode layer 16.

The substrate layer 11 includes a base 111 and an anode layer 112. The base 111 can be a glass substrate or a transparent plastic substrate. The anode layer 112 is formed on the base 111. The anode layer 112 is made of an indium tin oxide material. The hole injection layer 12 is formed on the anode layer 112. The hole transport layer 13 is formed on the hole injection layer 12. The light emitting layer 14 is formed on the hole transport layer 13. The light emitting layer 14 includes the electroluminescent material, a structural formula of the electroluminescent material is $R_2$-$R_1$-$R_2$, wherein a structural formula of $R_1$ group includes one selected from the group consisting of

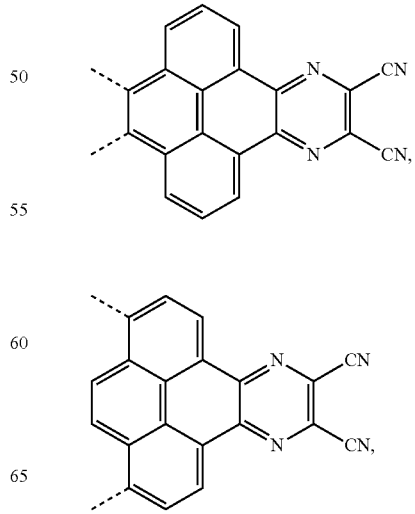

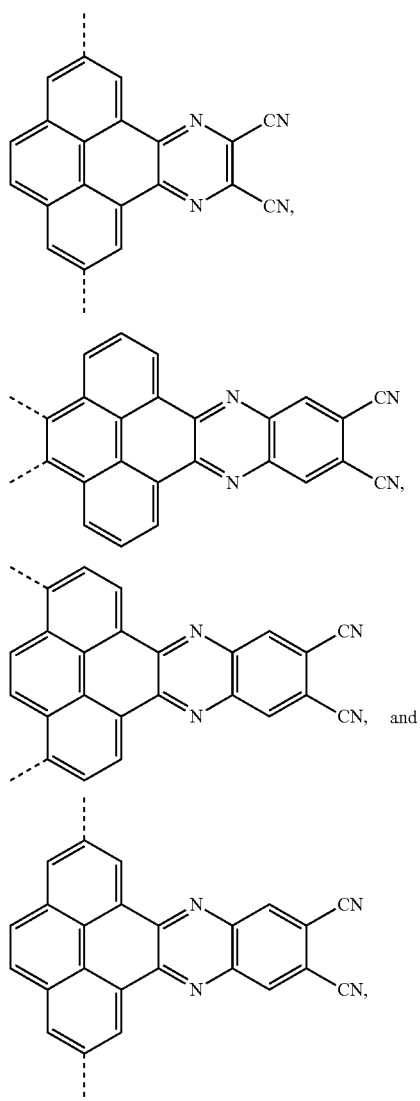

and a structural formula of $R_2$ group includes one selected from the group consisting of

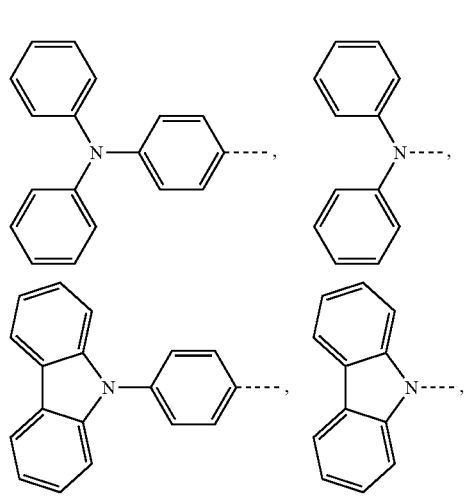

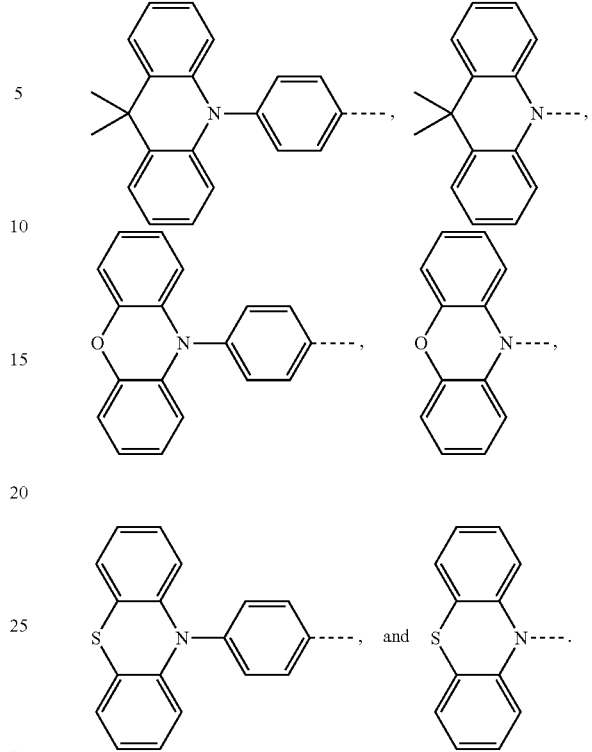

The electron transport layer 15 is formed on the light emitting layer 14. The cathode layer 16 is formed on the electron transport layer 15. The cathode layer 16 can be a lithium fluoride/aluminum material.

In a plurality of embodiment, a thickness of the hole injection layer can be 10 nm-50 nm. A thickness of the hole transport layer can be 20nm-60nm. A thickness of the light emitting layer can be 20nm-60nm. A thickness of the electron transport layer can be 20nm-60nm. A thickness of the cathode layer can be 80nm-120nm.

The light emitting device 1 and device 2 are manufactured according to a well-known method in the art, the light emitting layer of the device 1 includes

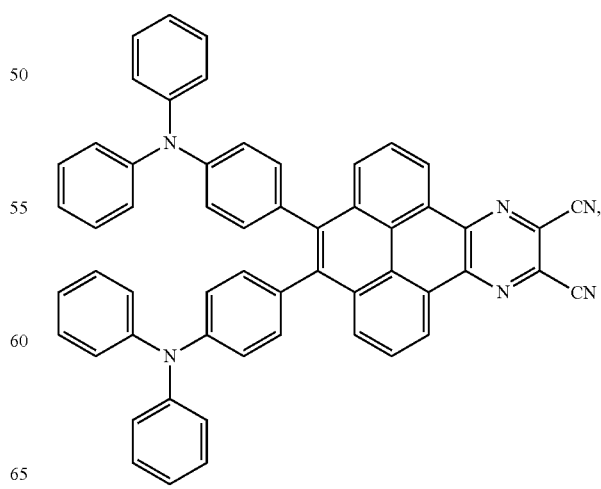

and the light emitting layer of the device 2 includes

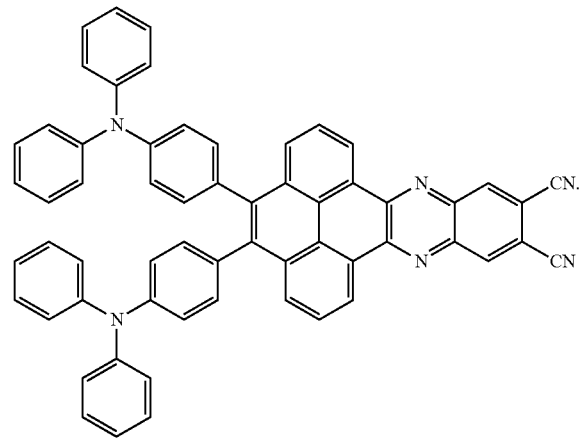 [SMILES: N#Cc1cc2nc3c4cccc5c(-c6ccc(N(c7ccccc7)c7ccccc7)cc6)c(-c6ccc(N(c7ccccc7)c7ccccc7)cc6)c6cccc(c3nc2cc1C#N)c6c54]

Referring to table 2, table 2 is a performance data sheet of the light emitting device of the present application

TABLE 2

| Device | Maximum Luminance (cd/m$^2$) | EL peak (nm) | Maximum External Quantum Efficiency (%) |
| --- | --- | --- | --- |
| Device 1 | 2395 | 685 | 12 |
| Device 2 | 1983 | 727 | 9 |

The present application provides an electroluminescent material, a method for manufacturing the electroluminescent material, and a light emitting device, and via reacting the first reactant and the second reactant to generate the first intermediate product, reacting the first intermediate product and the third reactant to generate the electroluminescent material, and the asymmetric monocyanopyrazine of the pyrene nucleus is used as an acceptor, and the pyrene nucleus has a large plane and rigid P-type delayed fluorescence characteristic, which can combine triplet excitons via triplet excitons-triplet excitons to enhance utilization of excitons, thereby to achieve an electroluminescent material, a method for manufacturing the electroluminescent material, and a light emitting device, to realize an electroluminescent material and a light emitting device with a high quantum efficiency.

The embodiments of the present application are described in detail above, and the principles and implementations of the present application are set forth in the specific examples. The description of the above embodiments is only for helping to understand the present application. In the meantime, those skilled in the art will be able to change the specific embodiments and the scope of the application according to the idea of the present application. In the above, the content of the specification should not be construed as limiting the present application.

What is claimed is:

1. An electroluminescent material, wherein a structural formula of the electroluminescent material is $R_2$-$R_1$-$R_2$, wherein a structural formula of the $R_1$ group comprises one selected from the group consisting of

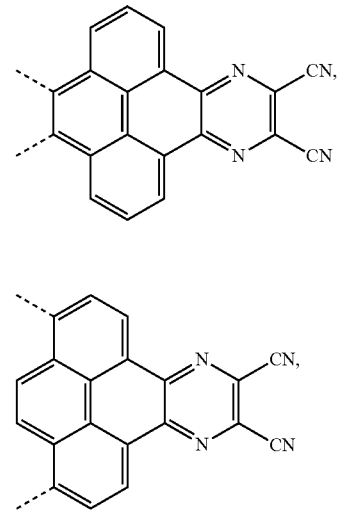

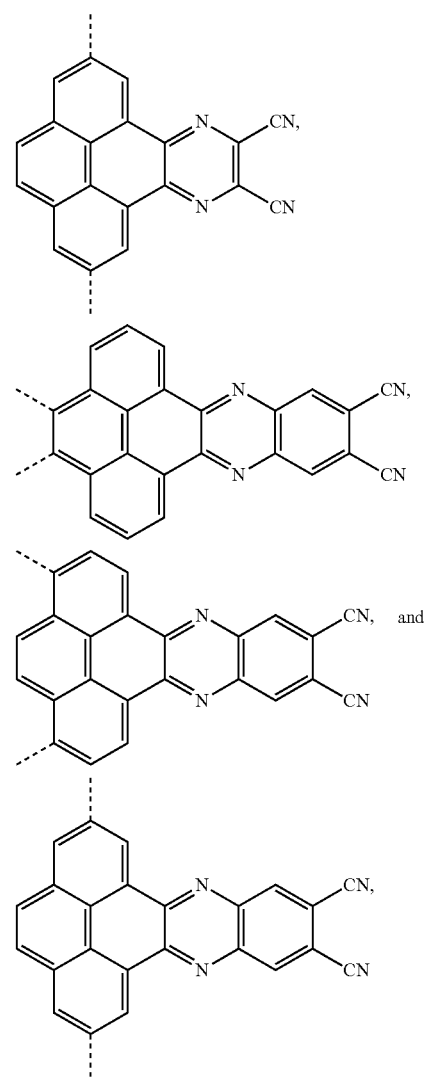

and a structural formula of the $R_2$ group comprises one selected from the group consisting of

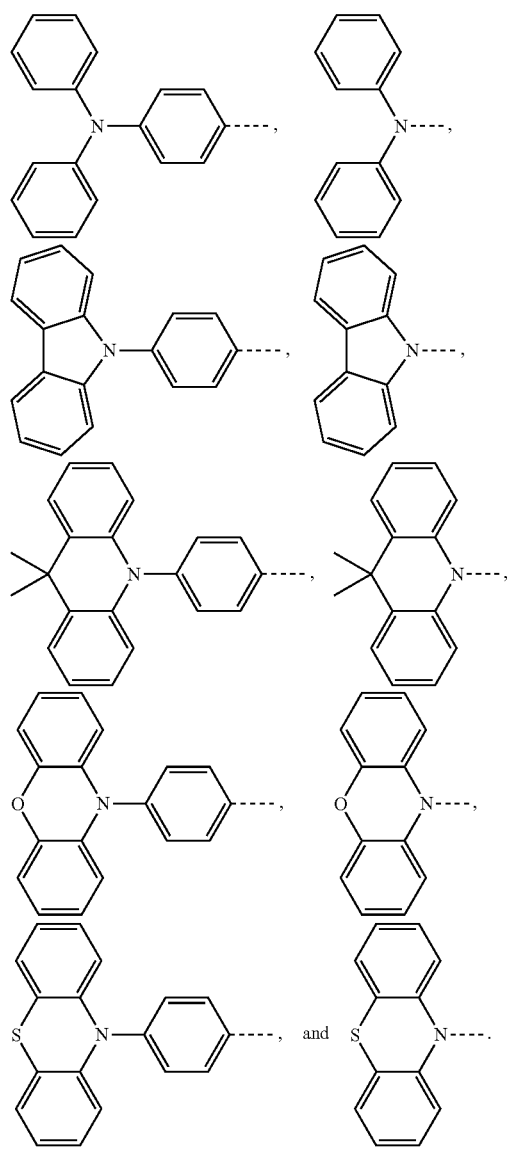

2. The electroluminescent material of claim 1, wherein the structural formula of the electroluminescent material is

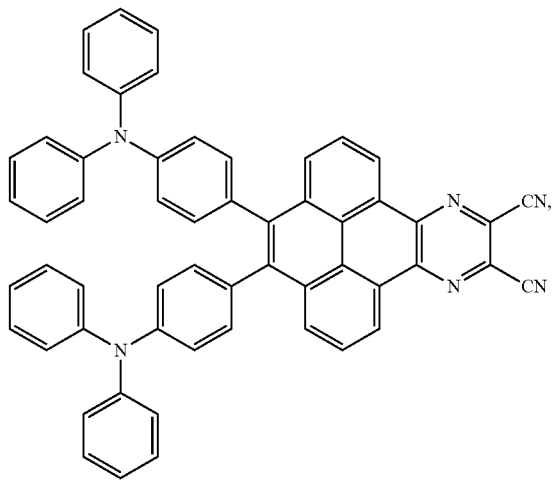 [SMILES: N#Cc1nc2c3cccc4c(-c5ccc(N(c6ccccc6)c6ccccc6)cc5)c(-c5ccc(N(c6ccccc6)c6ccccc6)cc5)c5cccc(c2nc1C#N)c5c43]

and a peak value of the electroluminescent material

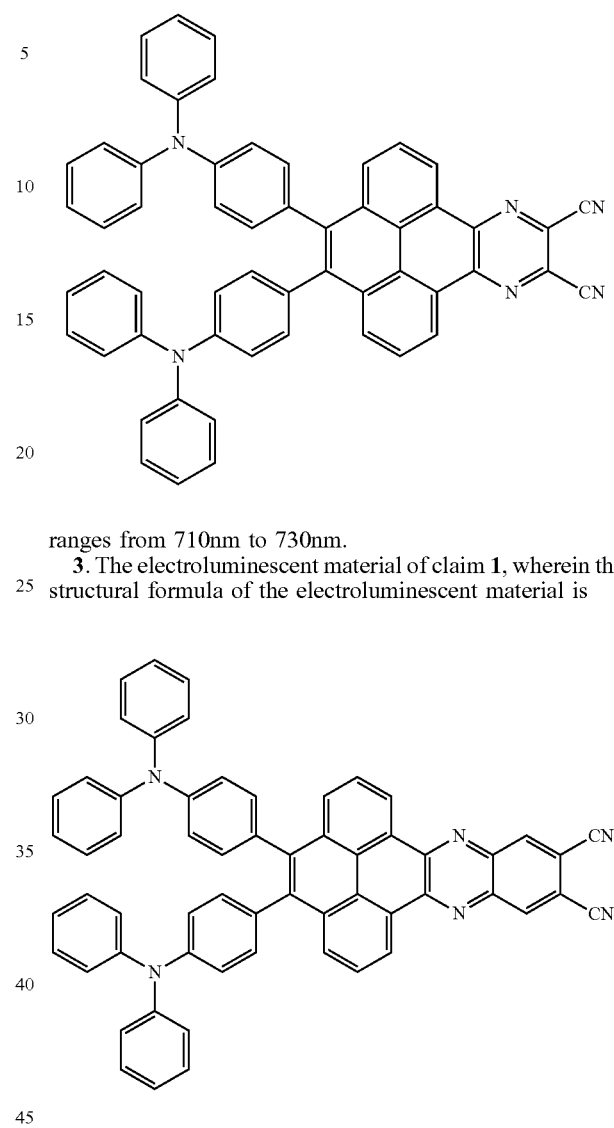

ranges from 710nm to 730nm.

3. The electroluminescent material of claim 1, wherein the structural formula of the electroluminescent material is

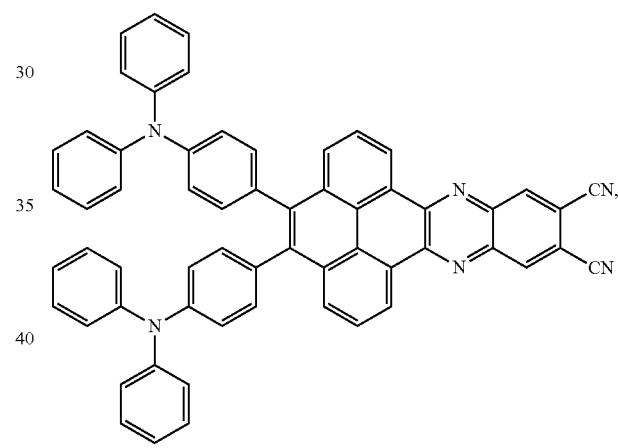

and a peak value of the electroluminescent material

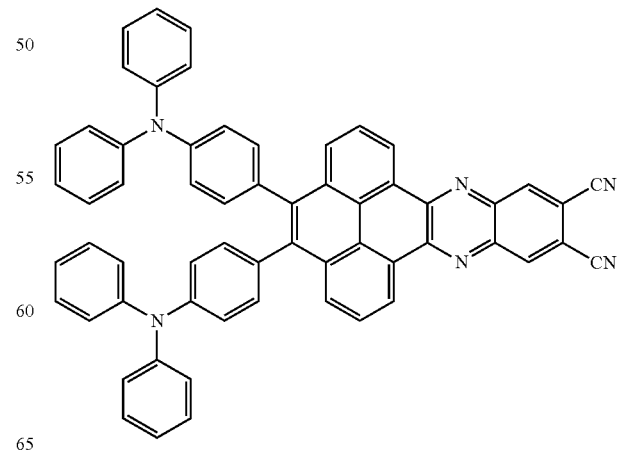

ranges from 750nm to 770nm.

4. A method for manufacturing an electroluminescent material, comprising:

providing a first reactant and a second reactant, and reacting the first reactant and the second reactant to generate a first intermediate product, wherein the first reactant is a compound containing a $R_3$ group, a structural formula of the $R_3$ group is one selected from the group consisting of

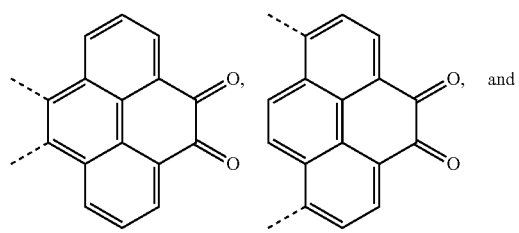

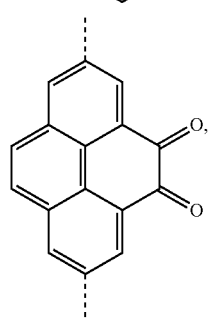

a structural formula of the second reactant is

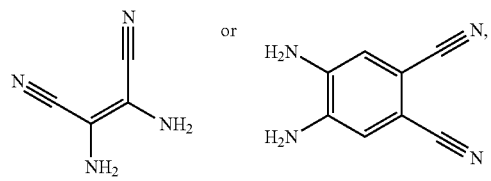 [SMILES: N#C/C(N)=C(/N)C#N ; N#Cc1cc(N)c(N)cc1C#N]

the first intermediate product is a compound containing a $R_1$ group, a structural formula of the $R_1$ group is one selected from the group consisting of

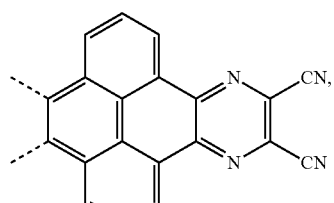

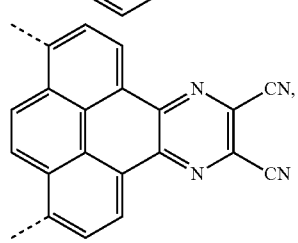

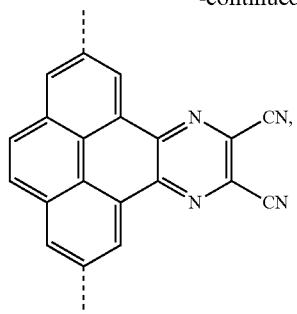

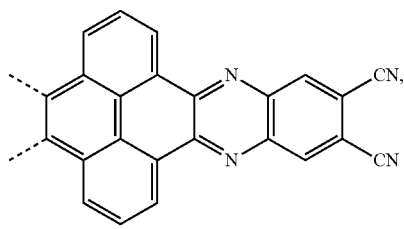

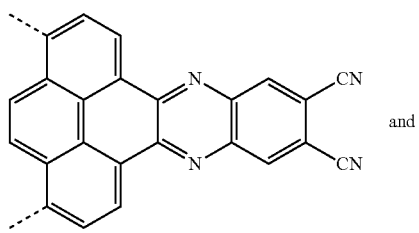

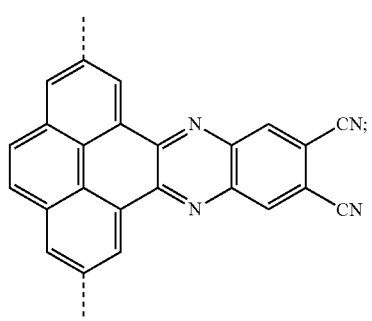

and providing a third reactant, and reacting the first intermediate product and the third reactant to generate the electroluminescent material, wherein the third reactant comprises a compound containing a $R_2$ group, and a structural formula of the $R_2$ group is

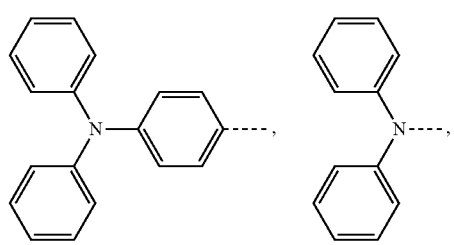

-continued

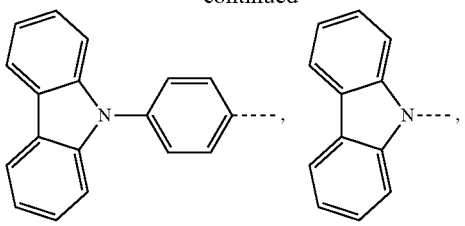

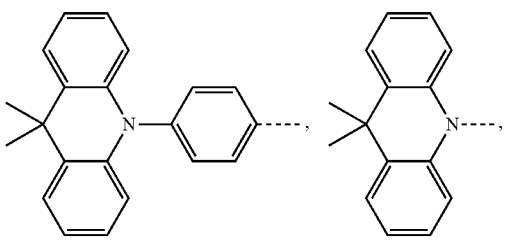

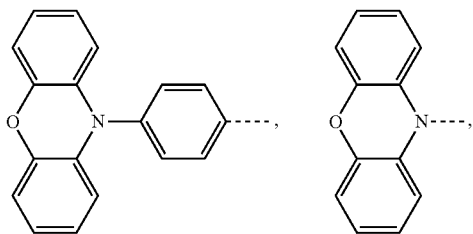

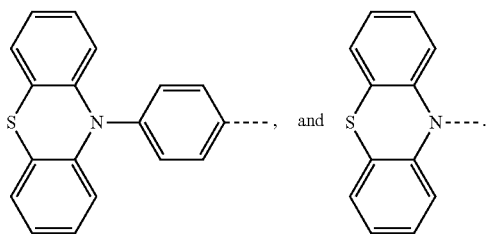

5. The method for manufacturing the electroluminescent material of claim 4, wherein a structural formula of the first reactant is Br—$R_3$—Br, a structural formula of the first intermediate product is Br—$R_1$—Br.

6. The method for manufacturing the electroluminescent material of claim 4, wherein in the step of reacting the first reactant and the second reactant to generate the first intermediate product, a relationship between a molar quantity of the first reactant and a molar quantity of the second reactant is that for 10 millimoles of the first reactant, there are 5 millimoles-20 millimoles of the second reactant.

7. The method for manufacturing the electroluminescent material of claim 4, wherein the first reactant and the second reactant are reacted in a first solvent to generate the first intermediate product, and the first solvent comprises acetic acid, formic acid, formaldehyde, hydroxypropionic acid, thioglycolic acid, indole-3-acetic acid, methyl formate, 2-hydroxyacetaldehyde, ethyl formate, methyl acetate, peroxypropionic acid, peracetic acid, or combinations thereof.

8. The method for manufacturing the electroluminescent material of claim 4, wherein the third reactant is $R_2$—X, wherein the X group is a boronic acid group or a boronic acid pinacol ester group.

9. The method for manufacturing the electroluminescent material of claim 4, wherein in the step of reacting the first intermediate product and the third reactant to generate the electroluminescent material, a relationship between a molar quantity of the first intermediate product and a molar quantity of the third reactant is that for 5 millimoles of the first intermediate product, there are 8 millimoles-15 millimoles of the third reactant.

10. The method for manufacturing the electroluminescent material of claim 4, wherein the first intermediate product and the third reactant are reacted in a second solvent to generate the electroluminescent material, and the second solvent comprises tetrahydrofuran, formaldehyde, ether, vinyl ether, diisopropyl ether, perchloroethylene, trichloroethylene, acetone, ethylene glycol ether, triethanolamine, or combinations thereof.

11. The method for manufacturing the electroluminescent material of claim 10, wherein the second solvent contains an additive, the additive comprises sodium carbonate, potassium carbonate, potassium carbonate aqueous solution, tetrakis(triphenylphosphine)palladium, n-butyllithium, potassium hydroxide, sodium hydroxide and sodium t-butoxide, or combinations thereof.

12. The method for manufacturing the electroluminescent material of claim 11, wherein the second solvent is tetrahydrofuran, the additive is aqueous solution of sodium carbonate and tetrakis(triphenylphosphine)palladium.

13. The method for manufacturing the electroluminescent material of claim 4, wherein a structural formula of the electroluminescent material is $R_2$-$R_1$-$R_2$.

14. A light emitting device comprising:
a substrate layer, wherein the substrate layer comprises a base and an anode layer, the anode layer is formed on the base;
a hole injection layer, wherein the hole injection layer is formed on the anode layer;
a hole transport layer, wherein the hole transport layer is formed on the hole injection layer;
a light emitting layer, wherein the light emitting layer is formed on the hole transport layer;
an electron transport layer, wherein the electron transport layer is formed on the light emitting layer; and
a cathode layer, wherein the cathode layer is formed on the electron transport layer;
wherein the light emitting layer comprises the electroluminescent material, wherein a structural formula of the electroluminescent material is $R_2$-$R_1$-$R_2$, wherein a structural formula of $R_1$ group comprises one selected from the group consisting of

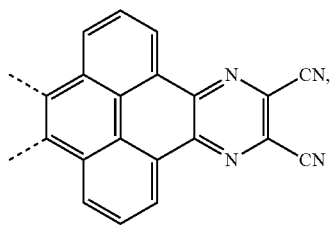

-continued
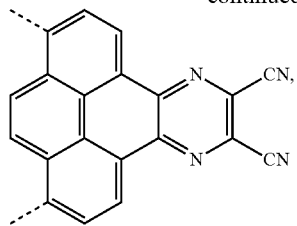
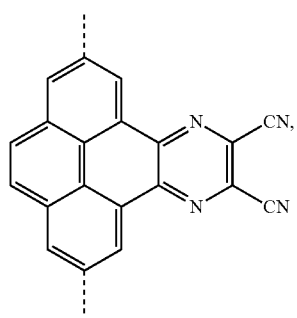
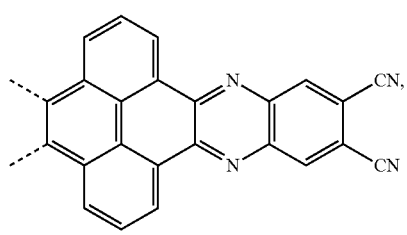
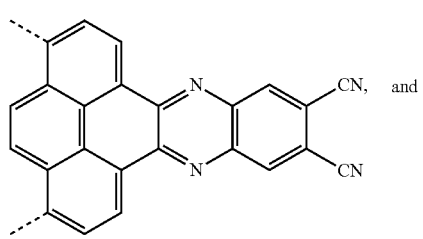, and
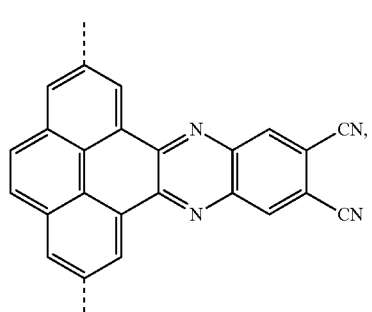
and a structural formula of R₂ group comprises one selected from the group consisting of
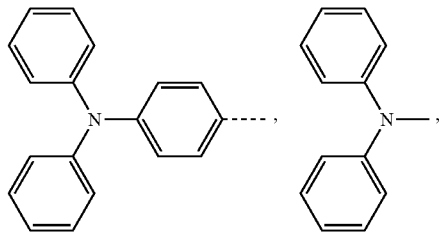
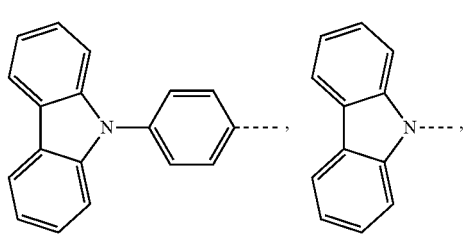
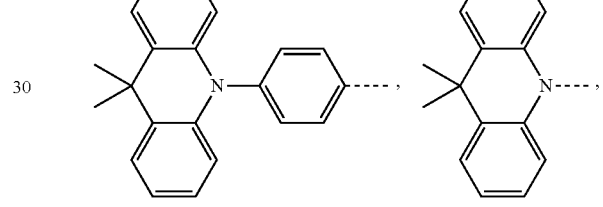
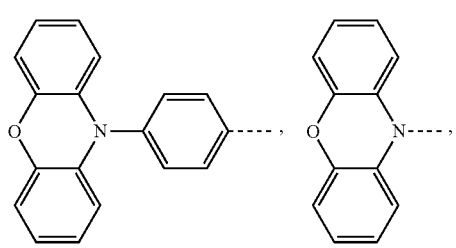
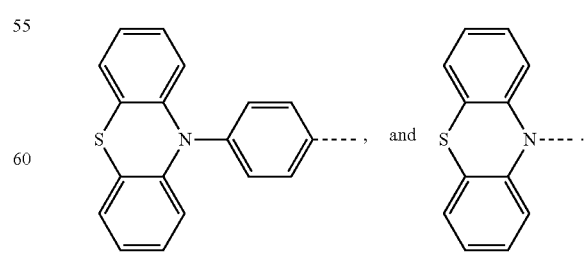
15. The light emitting device of claim 14, wherein the structural formula of the electroluminescent material is

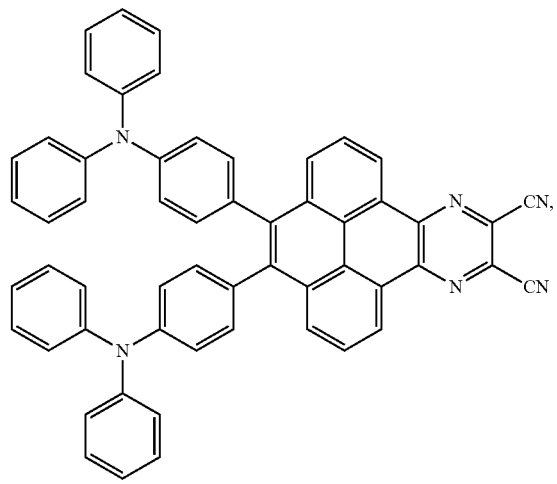 [SMILES: N#Cc1nc2c3cccc4c(-c5ccc(N(c6ccccc6)c6ccccc6)cc5)c(-c5ccc(N(c6ccccc6)c6ccccc6)cc5)c5cccc(c2nc1C#N)c5c43]
and a peak value of the electroluminescent material ranges from 710nm to 730nm.
16. The light emitting device of claim 14, wherein the structural formula of the electroluminescent material is
and a peak value of the electroluminescent material ranges from 750nm to 770nm.
17. The light emitting device of claim 14, wherein a thickness of the light emitting layer ranges from 20nm to 60nm.
* * * * *